(12) United States Patent
Hu

(10) Patent No.: US 12,095,425 B2
(45) Date of Patent: Sep. 17, 2024

(54) AMPLIFIER WITH NON-LINEARITY CANCELLATION

(71) Applicant: Huawei Technologies Co., Ltd., Shenzhen (CN)

(72) Inventor: Yaqi Hu, Apex, NC (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/168,177

(22) Filed: Feb. 13, 2023

(65) Prior Publication Data
US 2023/0198476 A1    Jun. 22, 2023

Related U.S. Application Data

(60) Division of application No. 17/174,956, filed on Feb. 12, 2021, now Pat. No. 11,581,856, which is a continuation of application No. PCT/CN2019/106317, filed on Sep. 18, 2019.

(60) Provisional application No. 62/737,642, filed on Sep. 27, 2018.

(51) Int. Cl.
H03F 1/32        (2006.01)
H03F 3/45        (2006.01)

(52) U.S. Cl.
CPC ....... H03F 1/3211 (2013.01); H03F 3/45076 (2013.01)

(58) Field of Classification Search
CPC ............... H03F 1/3211; H03F 3/45076; H03F 2203/45391; H03F 3/211; H03F 3/45085

USPC .................................. 330/252–261, 310, 149
See application file for complete search history.

(56) References Cited

U.S. PATENT DOCUMENTS 9,768,738 B2 *   9/2017   Honda ..................... H03F 3/19
10,749,716 B2    8/2020   Chen et al.

OTHER PUBLICATIONS

Restriction Requirement dated Feb. 15, 2022, U.S. Appl. No. 17/174,956.
Response to Restriction Requirement dated Apr. 15, 2022, U.S. Appl. No. 17/174,956.
Non-Final Office Action dated Jun. 1, 2022, U.S. Appl. No. 17/174,956.
Response to Non-Final Office Action dated Aug. 31, 2022, U.S. Appl. No. 17/174,956.
Notice of Allowance dated Oct. 19, 2022, U.S. Appl. No. 17/174,956.

* cited by examiner

Primary Examiner — Hieu P Nguyen
(74) Attorney, Agent, or Firm — Vierra Magen Marcus LLP

(57) ABSTRACT

An amplifier circuit includes a primary differential amplifier circuit connected to receive a differential input and provide a primary differential output with a first non-linearity. A secondary differential amplifier circuit is connected to receive the differential input. The secondary differential amplifier circuit is configured to generate a secondary differential output with a second non-linearity. The secondary differential output and the primary differential output are coupled together with opposing polarities such that the second non-linearity cancels out at least the first non-linearity.

17 Claims, 16 Drawing Sheets

AMPLIFIER WITH NON-LINEARITY CANCELLATION

CROSS-REFERENCE

This application is a divisional of, and claims priority to, U.S. patent application Ser. No. 17/174,956, entitled "Amplifier With Non-Linearity Cancellation", filed Feb. 12, 2021, which claims priority to PCT/CN2019/106317, filed Sep. 18, 2019, entitled "Amplifier With Non-Linearity Cancellation", which claims priority to U.S. Provisional Patent Application Ser. No. 62/737,642, filed on Sep. 27, 2018, entitled "Amplifier With Non-Linearity Cancellation", which applications are incorporated by reference herein in their entirety.

FIELD

The disclosure generally relates to amplifiers that amplify electrical signals with some non-linearity.

BACKGROUND

Amplifiers are used to amplify electrical signals in a wide range of applications. In some arrangements, an amplifier may include two or more amplifier stages connected in series. Amplifier stages may include one or more amplifier stages including differential amplifier stages and single-output amplifier stages. An amplifier stage may have non-linear characteristics so that it does not amplify equally across its operating range. In amplifiers with two or more amplifier stages, overall non-linearity may be increased compared with a single-stage amplifier.

BRIEF SUMMARY

According to one aspect of the present disclosure, there is provided an amplifier circuit that includes a primary differential amplifier circuit connected to receive a differential input and provide a primary differential output with a first non-linearity and a secondary differential amplifier circuit connected to receive the differential input. The secondary differential amplifier circuit is configured to generate a secondary differential output with a second non-linearity. The secondary differential output and the primary differential output are coupled together with opposing polarities such that the second non-linearity cancels out at least the first non-linearity. This provides reduced overall non-linearity, which may improve signal quality and reduce bit error rate in digital communications systems.

Optionally, in any of the preceding aspects, the primary differential output and the secondary differential output are coupled together with opposing polarities to generate a combined output that has a combined non-linearity that is less than the first non-linearity and a combined amplitude that is less than an amplitude of the primary differential amplifier circuit.

Optionally, in any of the preceding aspects, the primary differential amplifier circuit has a first current and the secondary differential amplifier circuit has a second current that is less than the first current.

Optionally, in any of the preceding aspects, the primary differential amplifier circuit is linear over a first voltage range and the secondary differential amplifier circuit is linear over a second voltage range that is smaller than the first voltage range.

Optionally, in any of the preceding aspects, the primary differential amplifier circuit includes two primary transistors in a primary differential pair and a primary current source, the secondary differential amplifier circuit includes two secondary transistors in a secondary differential pair and a secondary current source, the secondary transistors are smaller than the primary transistors and the secondary current source generates a smaller current than the primary current source.

Optionally, in any of the preceding aspects, the two primary transistors include a first transistor coupled to a first conductor of the differential input and a second transistor coupled to a second conductor of the differential input, the two secondary transistors include a third transistor coupled to the first conductor of the differential input and a fourth transistor coupled to the second conductor of the differential input, a terminal of the first transistor coupled directly to a terminal of the fourth transistor, and a terminal of the second transistor coupled directly to a terminal of the third transistor.

Optionally, in any of the preceding aspects, the secondary differential amplifier circuit further includes variable resistors and the secondary current source is a variable current source for tuning non-linearity of the secondary differential amplifier circuit.

Optionally, in any of the preceding aspects, the amplifier circuit further includes one or more single-output amplifier stages connected in series with the primary differential amplifier circuit and the secondary differential amplifier circuit, an output of the one or more single-output amplifier stages provided to a laser device.

According to one other aspect of the present disclosure, there is provided an amplifier circuit that includes a first single-output amplifier stage having a first non-linearity and a second single-output amplifier stage coupled in series with the first single-output amplifier stage. The second single-output amplifier stage has configurable non-linearity, the configurable non-linearity of the second single-output amplifier stage configured to cancel out at least the first non-linearity such that combined non-linearity of at least the first single-output amplifier stage and the second single-output amplifier stage in series is less than the first non-linearity.

Optionally, in any of the preceding aspects, the second single-output amplifier stage has a differential input and a single-output output that is coupled to the first single-output amplifier stage.

Optionally, in any of the preceding aspects, the second single-output amplifier stage includes a first transistor and a second transistor in a differential pair with the differential input controlling the first and second transistors and includes a third transistor and a resistor forming a configurable voltage source coupled to a tail of the differential pair.

Optionally, in any of the preceding aspects, the second single-output amplifier stage has a single input from the first single-output amplifier stage.

Optionally, in any of the preceding aspects, the second single-output amplifier stage includes a first transistor controlled by the single input and a configurable voltage source connected in series with the first transistor.

Optionally, in any of the preceding aspects, a first terminal of the first transistor is connected to a supply voltage through a first resistor, a second terminal of the first transistor is connected to a second resistor in series with a third resistor, and the configurable voltage source includes a second transistor connected between the supply voltage and a node located between the second resistor and the third resistor, the second transistor controlled by a configurable bias voltage to control non-linearity.

Optionally, in any of the preceding aspects, the amplifier circuit further includes one or more additional single-output amplifier stages connected in series with the first and second single-output amplifier stages, the configurable non-linearity of the second single-output amplifier stage configured such that combined non-linearity of the first single-output amplifier stage, the second single-output amplifier stage, and the one or more additional single-output amplifier stages in series is less than non-linearity of the first single-output amplifier stage and the one or more additional single-output amplifier stages without the second single-output amplifier stage.

Optionally, in any of the preceding aspects, the amplifier circuit further includes one or more differential amplifier stages having differential inputs and differential outputs, the one or more differential amplifier stages connected in series with the first single-output amplifier stage and the second single-output amplifier stage, an output of the amplifier circuit provided to a laser device.

According to still one other aspect of the present disclosure, there is provided a circuit that includes one or more single-input single-output amplifier stages; a differential-input single-output amplifier stage connected in series with the one or more single-input single-output amplifier stages to provide a signal to the one or more single-input single-output amplifier stages; one or more differential-input differential-output amplifier stages connected in series with the one or more single-input single-output amplifier stages and the differential-input single-output amplifier stage to provide a differential signal to the differential-input single-output amplifier stage; and a secondary differential amplifier circuit connected to a primary differential amplifier circuit in an individual differential-input differential-output amplifier stage, the secondary differential amplifier circuit configured to receive a same differential input as the primary differential amplifier circuit, the secondary differential amplifier circuit configured to generate a secondary differential output that is opposite in polarity to a primary differential output of the primary differential amplifier circuit such that non-linearity of secondary differential amplifier circuit cancels non-linearity of at least the primary differential amplifier circuit, the secondary differential output and the primary differential output coupled together to generate a combined output.

Optionally, in any of the preceding aspects, the primary differential amplifier circuit has a first non-linearity, the secondary differential amplifier circuit has a second non-linearity, and the combined output has a combined non-linearity that is less than the first non-linearity or of opposite shape to the first non-linearity.

Optionally, in any of the preceding aspects, one or more amplifier stages of the one or more single-input single-output amplifier stages and the differential-input single-output amplifier stage have configurable non-linearity configured to reduce at least voltage level separation S1 to S3 mismatch non-linearity of an output of the one or more single-input single-output amplifier stages.

Optionally, in any of the preceding aspects, the circuit further includes a laser device coupled to an output of the one or more single-input single-output amplifier stages, the laser device generating an optical four-level Pulse Amplitude Modulation (PAM4) signal.

According to still one other aspect of the present disclosure, there is provided an amplifier circuit that includes a primary differential amplifier module for receiving a differential input and generating a primary differential output with a first non-linearity; a secondary differential amplifier module for receiving the differential input and generating a secondary differential output with a second non-linearity; and an output module that couples the secondary differential output and the primary differential output together with opposing polarities such that the second non-linearity cancels out at least the first non-linearity.

According to still one other aspect of the present disclosure, there is provided an amplifier circuit including a first single-output amplifier module having a first non-linearity; and a second single-output amplifier module coupled in series with the first single-output amplifier stage, the second single-output amplifier stage having configurable non-linearity, the configurable non-linearity of the second single-output amplifier stage configured to cancel out at least the first non-linearity such that combined non-linearity of at least the first single-output amplifier stage and the second single-output amplifier stage in series is less than the first non-linearity.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

The present disclosure will now be described with reference to the figures, which in general relate to amplifier circuits for amplifying electrical signals and to connecting such amplifier circuits in amplifiers so that non-linearity of a primary amplifier circuit may be canceled out, or partially canceled out, by non-linearity of a secondary amplifier circuit in the amplifier stage or by non-linearity of another amplifier stage. By configuring and connecting amplifier stages appropriately, such cancelation may be used to reduce overall non-linearity of an amplifier and thus improve an output signal of the amplifier.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
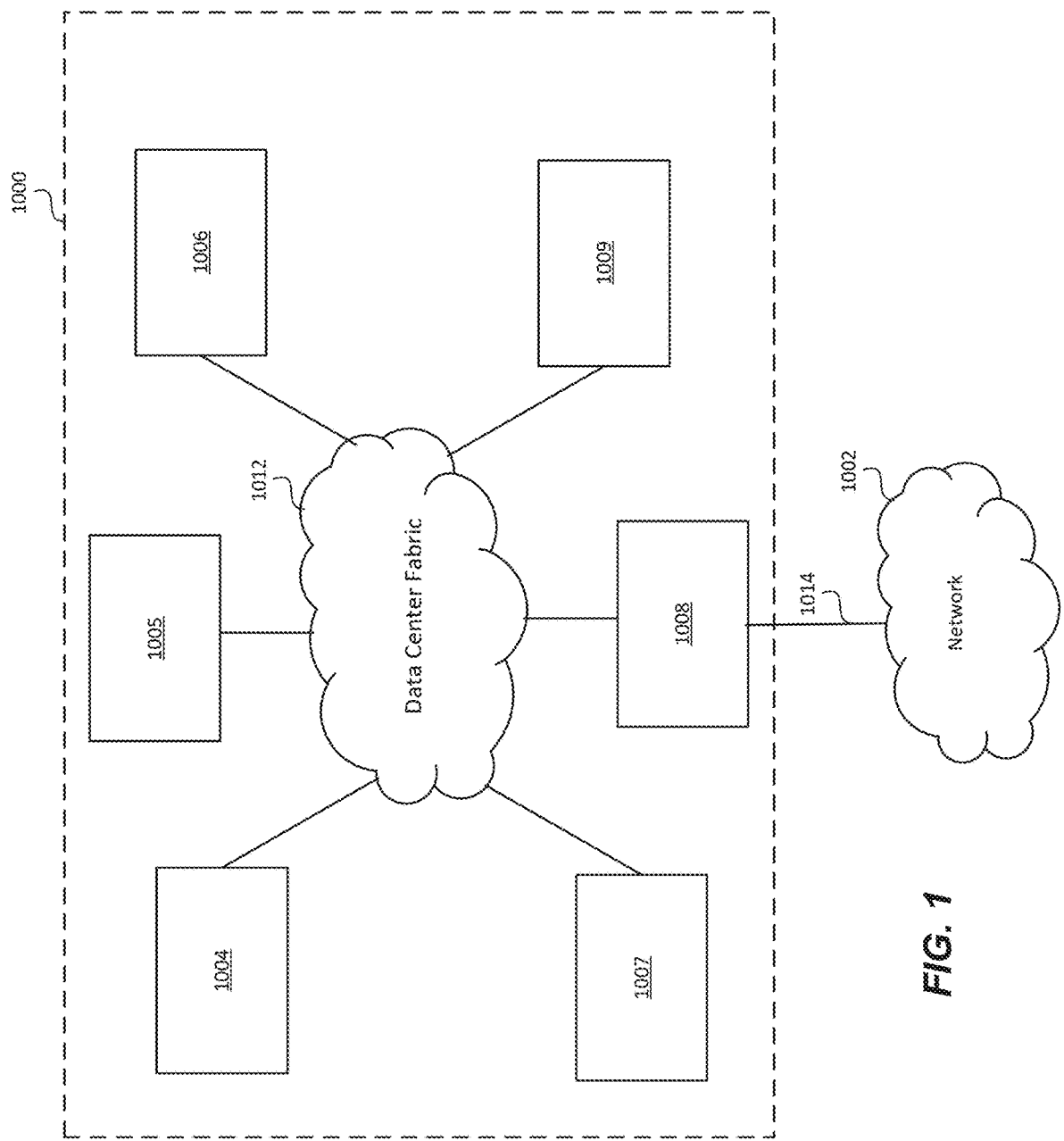
FIG. 1 illustrates an example of a data center connected to a network.

FIG. 1 illustrates an example of a data center 1000 coupled to a network 1002 (e.g. to the Internet). Data center components 1004, 1005, 1006, 1007, 1008, 1009 are coupled together by data center fabric 1012. Data center components 1004, 1005, 1006, 1007, 1008, 1009 may include one or more data storage units (e.g. servers arranged in racks), load balancers, and other components. Data center fabric 1012 provides communication between data center components 1004, 1005, 1006, 1007, 1008, 1009. Data center fabric 1012 may include communication channels between data center components 1004, 1005, 1006, 1007, 1008, 1009. Communication channel 1014 connects data center component 1008 (e.g. a gateway server) with network 1002 and thus allows data transfer between data center 1000 and network 1002. Communication channels of data center fabric 1012 and communication channel 1014 may be high-capacity channels that transfer large volumes of data at high speeds. Such communication channels may use electrical and/or optical signals to transfer data.

Figure 2:
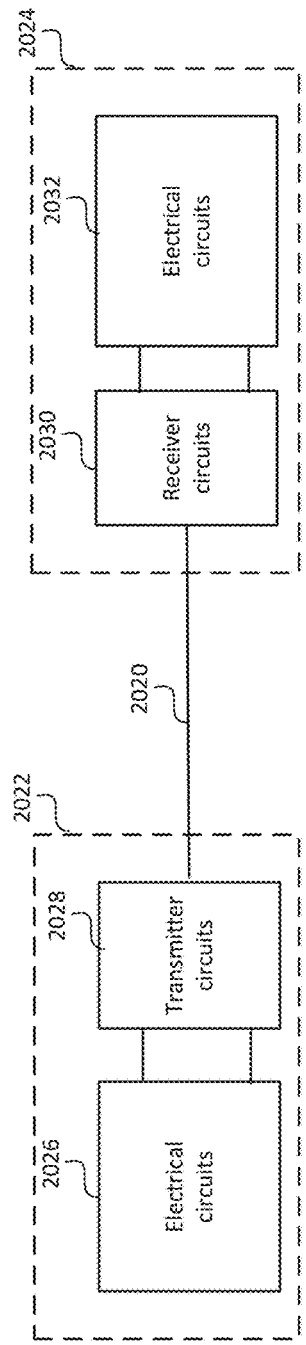
FIG. 2 illustrates an example of communication between data center components.

FIG. 2 shows an example of a communication channel 2020 between a first data center component 2022 and a second data center component 2024 (e.g. between any two of data center components 1004, 1005, 1006, 1007, 1008, 1009 in data center fabric 1012). Data center fabric 1012 may include multiple communication channels like communication channel 2020. Communication channel 1014 may be similarly implemented. First data center component 2022 includes electrical circuits 2026 and transmitter circuits 2028 coupled to communication channel 2020. Electrical circuits 2026 may include memory circuits (e.g. volatile and/or non-volatile memory circuits) configured to store data and logic circuits (e.g. one or more processors) configured to access stored data. Second data center component 2024 includes receiver circuits 2030 and electrical circuits 2032. Electrical circuits 2032 may include memory circuits (e.g. volatile and/or non-volatile memory circuits) configured to store data and logic circuits (e.g. one or more processors) configured to access stored data and may be similar to electrical circuits 2026. While FIG. 2 shows a simplified illustration with transmitter circuits 2028 in first data center component 2022 coupled by communication channel 2020 to receiver circuits 2030 in second data center component 2024, it will be understood that a given data center component may include both transmitter circuits and receiver circuits to allow two-way communication between data center components. Furthermore, any two data center components may be coupled by multiple communication channels and a given data center component may be coupled to multiple other data center components via multiple communication channels.

Figure 3A:
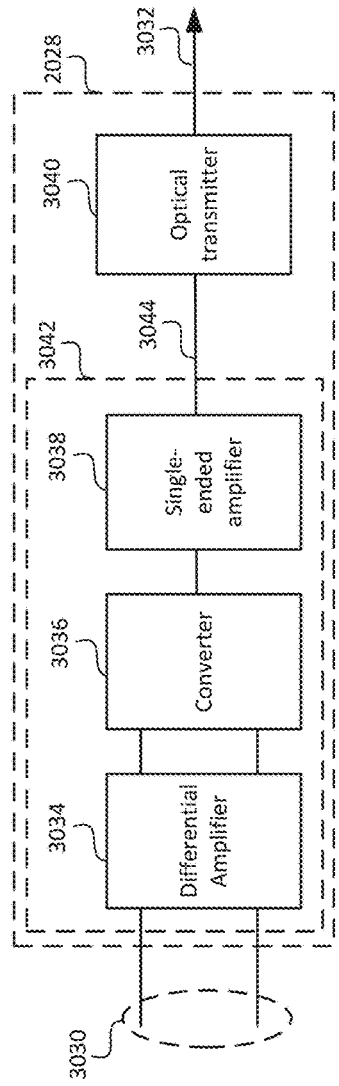
FIGS. 3A-B illustrate an example of an amplifier in a data center component.

FIG. 3A illustrates an example implementation of transmitter circuits 2028 where communication channel 2020 is an optical communication channel (e.g. fiber optic). Transmitter circuits 2028 receive a differential input signal 3030 from electrical circuits 2026 and provide an optical signal 3032 to communication channel 2020. Transmitter circuits 2028 include a differential amplifier 3034, a differential-input-to-single-output converter 3036, a single-output amplifier 3038, and an optical transmitter 3040. The combination of differential amplifier 3034, converter 3036, and single-output amplifier 3038 connected in series may be considered to form an amplifier 3042, that receives differential input signal 3030 and provides a single output signal 3044, to optical transmitter 3040. Amplifier 3042 may be considered a driver of optical transmitter 3040. Optical transmitter 3040 may be any suitable optical transmitter that converts a single-output electrical signal to an optical signal. An example of an optical transmitter that may be used as optical transmitter 3040 is a solid-state laser device such as a Vertical Cavity Surface-Emitting Laser (VCSEL). It will be understood that such an optical transmitter may use an input signal of a significantly higher voltage or current swing than used by electrical circuits 2026 so that significant amplification of differential input signal 3030 may be used to generate a single output at output signal 3044 with sufficient voltage for optical transmitter 3040.

Figure 3B:
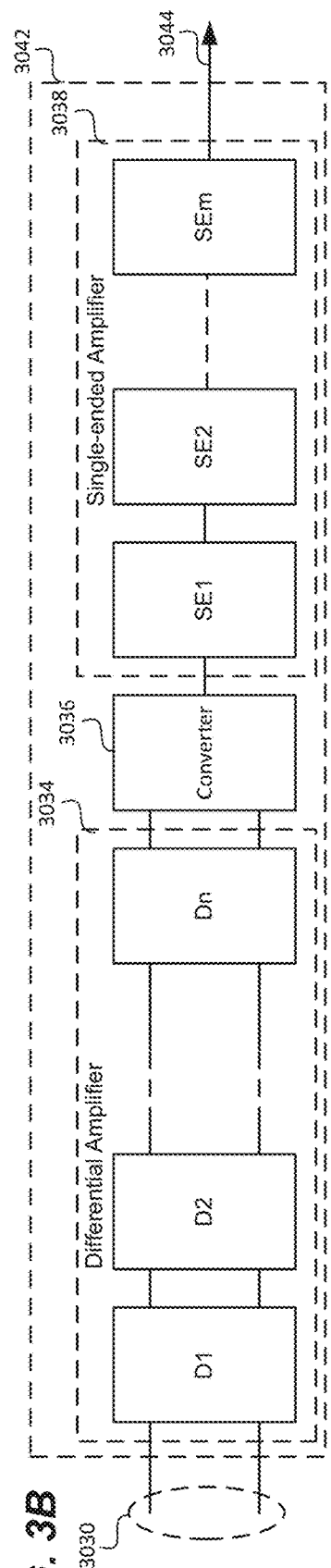

FIG. 3B illustrates an example implementation of amplifier 3042 including differential amplifier 3034, converter 3036, and single-output amplifier 3038 coupled in series to provide sufficient amplification for optical transmitter 3040. In particular, multiple amplifier stages are connected in series to generate successively greater voltages and thereby generate a sufficient voltage at output signal 3044. Differential amplifier 3034 includes n differential-input differential-output amplifier stages D1 to Dn connected in series, where n may be any suitable number. Single-output amplifier 3038 includes m single-input single-output amplifier stages SE1 to SEm connected in series, where m may be any suitable number. The differential output of differential amplifier 3034 is provided to converter 3036, which provides a single-output to single-output amplifier 3038. Thus differential-input differential-output amplifier stages D1 to Dn of differential amplifier 3034 and single-input single-output amplifier stages SE1 to SEm of single-output amplifier 3038 are connected in series. In some examples, converter 3036 may be implemented as a differential-input single-output amplifier stage, which is connected in series between differential amplifier 3034 and single-output amplifier 3038. Because such an amplifier stage is single-output, it may be considered part of single-output amplifier 3038.

Different voltage levels may be used to convey different digital logic states in a variety of ways using different modulation schemes. For example, in some systems, a low voltage indicates a first logic state or bit (e.g. logic 0 or 1) while a high voltage indicates a second logic state or bit (e.g. logic 1 or 0). Thus, each of the two voltage levels corresponds to one bit. In some systems, signal voltages are mapped to multi-bit logic states to increase the number of bits that can be transmitted at a time over a given channel.

For example, four-state Pulse Amplitude Modulation (PAM4) modulation uses four different voltage levels, each representing two bits, so that the number of bits sent in a given time period, or pulse, is twice as much as a single-state modulation scheme. Such modulation may be used in a variety of applications, particularly where a large volume of data is transferred at high speeds, such as in a data center (e.g. in data center 1000).

Figure 4A:
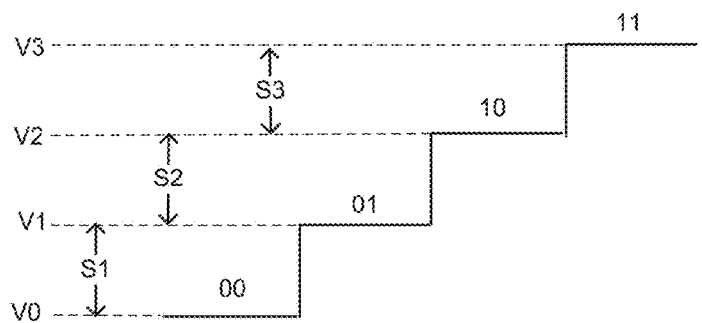
FIGS. 4A-B illustrate voltage level separation for PAM4 signals.

FIG. 4A illustrates four voltage levels V0, V1, V2, and V3, that are mapped to logic states 00, 01, 10, and 11 respectively according to a PAM4 modulation scheme. Separation between voltage levels in such signals is an important factor to ensure that a receiver correctly distinguishes voltage levels and correctly decodes a received signal. Where an electrical signal is converted to an optical signal, insufficient voltage level separation at a transmitter in combination with noise from a communication channel may result in misreading of data at a receiver. Thus, reduced voltage level separation between logic states in a transmitter may result in a receiver decoding a signal incorrectly. Therefore, it may be desirable to maintain equal voltage level separation between such voltages. FIG. 4A shows voltage level separation S1 between voltages V0 and V1, voltage level separation S2 between voltages V1 and V2, and voltage level separation S3 between voltages V2 and V3.

Many amplifiers demonstrate some degree of non-linearity. While a theoretical amplifier may provide equal amplification throughout its range, real amplifiers may have some non-linearity. In some cases, an amplifier with non-linearity may result in non-uniform voltage level separation. Thus, while S1, S2, and S3 are shown as equal, in some cases, non-linear amplification by an amplifier may cause one or more such voltage level separation to be reduced. For example, where a PAM4 signal is amplified by amplifier 3042, non-linearity of one or more amplifier stages D1-Dn and/or SE1-SEm may cause output signal 3044 to have non-uniform voltage level separation, which may affect an optical four-level Pulse Amplitude Modulation (PAM4) signal generated by a laser device (e.g. VCSEL). A measure of such non-uniform voltage level separation in a PAM4 signal (and thus a measure of non-linearity of an amplifier producing such non-uniform level separation) is Ratio of Level separation Mismatch (RLM)

Figure 4B:
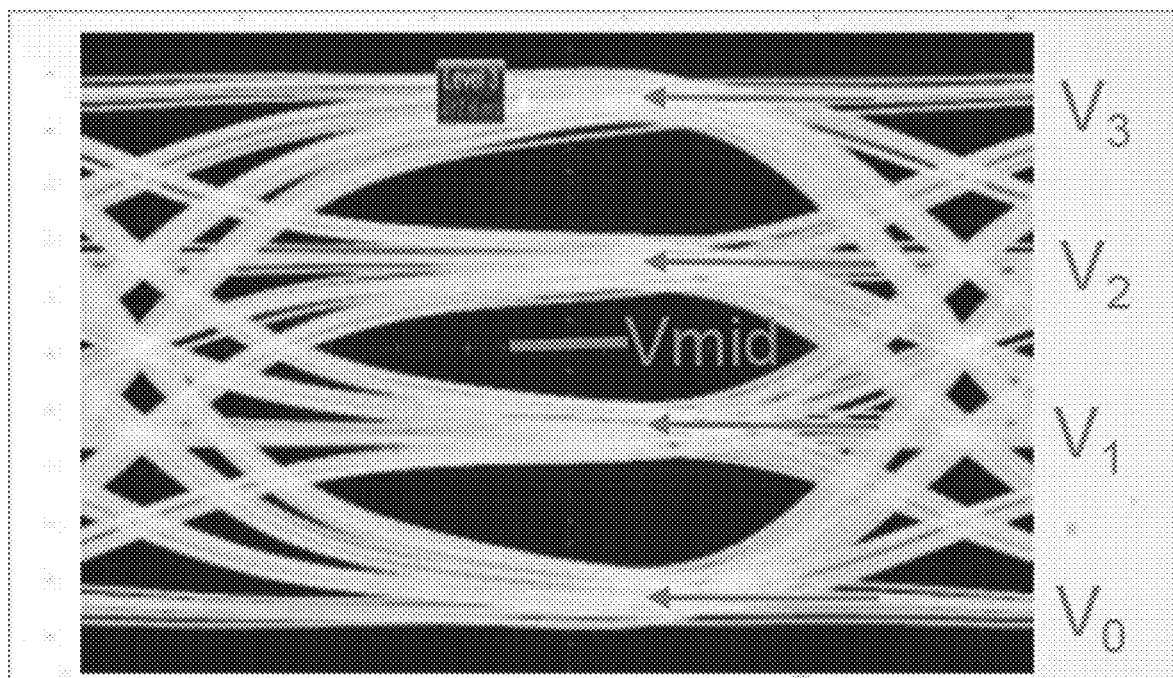

FIG. 4B illustrates voltage levels of a PAM4 signal that are used to calculate RLM. The eye diagram of FIG. 4B includes voltage Vmid, which is a voltage at the middle of the voltage range used:

$$Vmid = \frac{V0 + V3}{2}$$

Vmid is used to calculate effective symbol levels ES1 and ES2 of V1 and V2 respectively according to the following:

$$ES1 = \frac{V1 - Vmid}{V0 - Vmid}$$

$$ES2 = \frac{V2 - Vmid}{V3 - Vmid}$$

Where voltage level separation is uniform, ES1 and ES2 are equal ES1=ES2=⅓. RLM is a measure of how much these effective symbol levels deviate from these theoretical values and is given by the following:

RLM=min[(3*ES1),(3*ES2),(2−3*ES1),(2−3*ES2)]

Where voltage level separation is uniform, ES1=ES2=⅓, and RLM=1. Non-uniform voltage level separation results in an RLM value that is lower than 1. Some specifications may require signals with an RLM greater than a required value (e.g. an RLM value of 0.92 or more). Such a value may be challenging to achieve. For example, where two or more amplifier stages are connected together in series, each amplifier stage having some non-linearity (e.g. amplifier stages D1-Dn and SE1-SEm of amplifier 3042), the cumulative effect such non-linearities may result in an output signal with a poor RLM (e.g. RLM<0.92, or RLM=0.86).

Figure 5:
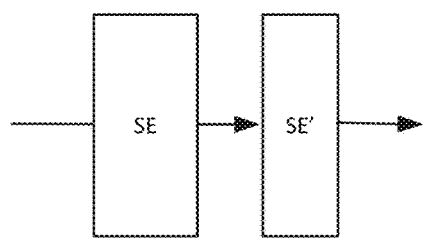
FIG. 5 illustrates single-output amplifier stages coupled in series.

Aspects of the present technology include configuring one or more amplifier stages so that non-linearity of a given amplifier stage or stages is canceled out, or partially canceled out, by a secondary amplifier circuit in the stage or by another amplifier stage. FIG. 5 illustrates an arrangement of a first single-output amplifier stage SE and a second single-output amplifier stage SE' which are connected in series so that non-linearity of the second single-output amplifier stage at least partially cancels out the non-linearity of the first single-output amplifier stage (e.g. SE and SE' may be any two single-output amplifier stages of single-output amplifier 3038). Specifically, second single-output amplifier stage SE' is configurable so that its non-linearity can be tuned according to non-linearity of first single-output amplifier stage SE and can be configured to cancel out (at least partially) the non-linearity of the first single-output amplifier stage SE (i.e. overall non-linearity of SE+SE', e.g. as measured by RLM, is less than non-linearity of SE alone). While second single-output amplifier stage SE' is the tunable stage in this example, in other examples a tunable amplifier stage may be tuned to cancel out non-linearity of a later amplifier stage or stages (e.g. first amplifier stage SE could be tunable according to non-linearity of second amplifier stage SE') and the present technology is not limited to any particular location or number of tunable amplifier stages.

Figure 6A:
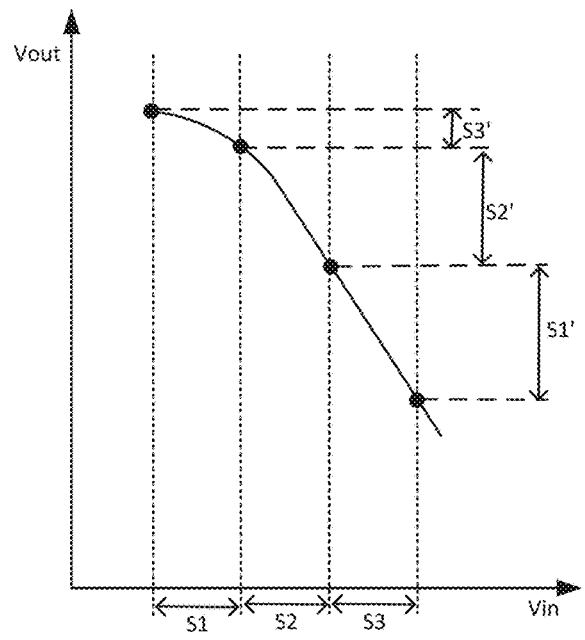
FIGS. 6A-D illustrate an example of canceling out non-linearity by single-output amplifier stages connected in series.

FIG. 6A illustrates non-linear amplification by first single-output amplifier stage SE and resulting non-uniform voltage level separation at the output of first single-output amplifier stage SE. First single-output amplifier stage SE receives an input voltage Vin with voltage levels that are equally spaced, with voltage level separations S1, S2, S3 being equal (i.e. an ideal or near ideal input). It can be seen that non-linearity of the first single-output amplifier stage SE results in greater amplification at lower output voltages than at higher output voltages so that the output voltage Vout shows a relatively small voltage level separation S3' at higher output voltage and a larger voltage level separation S1' at lower output voltage, with middle voltage level separation S2' being between S1' and S3'.

Figure 6B:
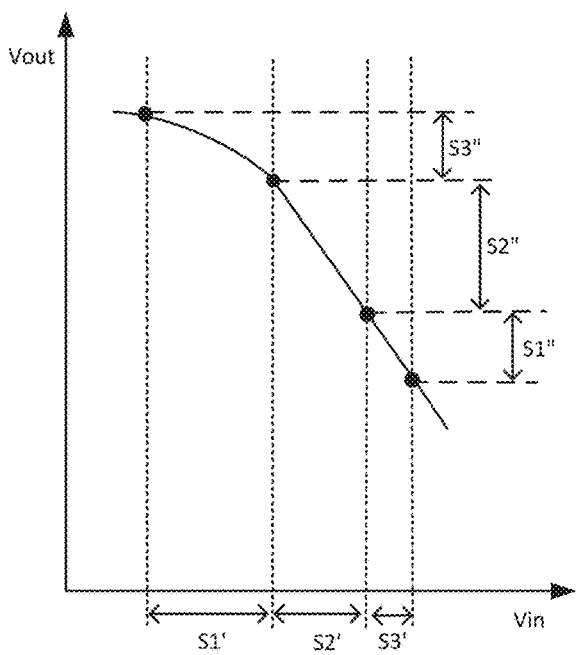

The output voltage Vout of first single-output amplifier stage SE is provided as an input voltage Vin to second single-output amplifier stage SE' as illustrated in FIG. 6B. The non-linearity of second single-output amplifier stage SE" is tuned to cancel out the non-linearity of the first single-output amplifier stage SE (i.e. the curve of FIG. 6B may selected by configuring second single-output amplifier SE" appropriately according to non-linearity of the first single-output amplifier SE). First and second single-stage amplifier stages SE and SE' are inverting amplifiers so that voltage level separation S3' at higher end of output voltage Vout of first single-output amplifier stage SE corresponds to separation S1" between lower voltages at the output of second single-output amplifier stage SE'. Higher amplification at this lower output voltage level and lower amplification at higher output voltage levels results in voltage level separation S1" being approximately the same as voltage level separation S3". Thus, the effect of non-linearity of second single-output amplifier stage SE' is to cancel out the effect of non-linearity of first single-output amplifier stage SE and to provide uniform level separation and thus an RLM value that is close to one.

Figure 6C:
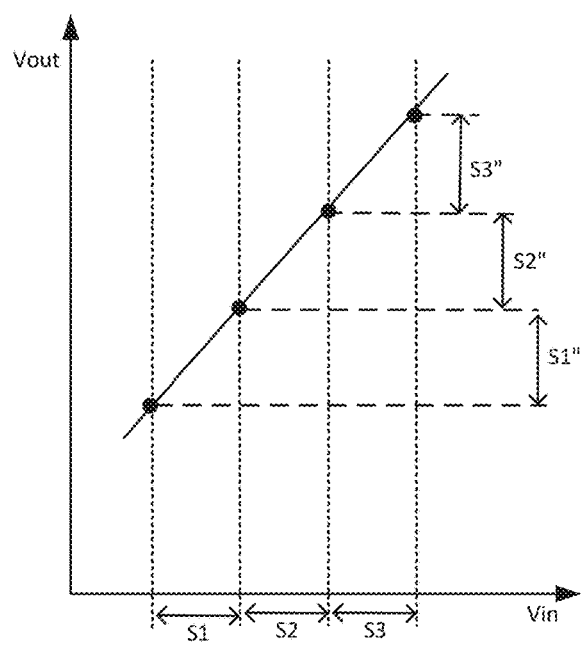
Figure 6D:
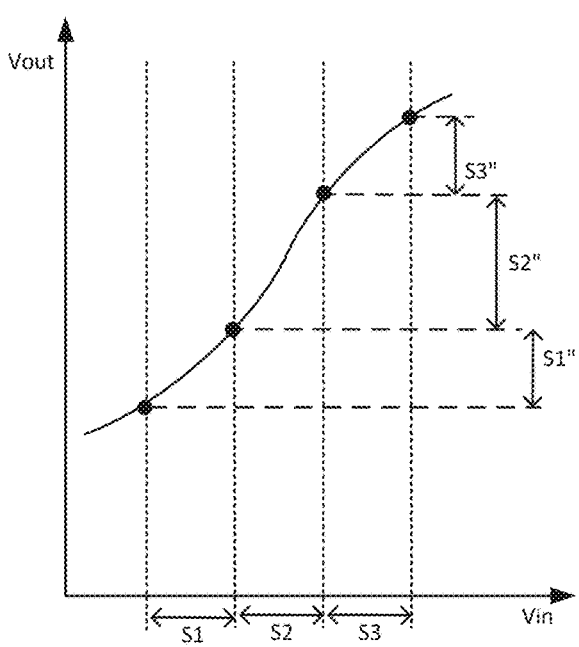

FIG. 6C shows the cumulative effects of the first non-linearity of first single-output amplifier stage SE and second non-linearity of second single-output amplifier stage SE' connected in series. The resulting transfer curve is straight (little or no non-linearity) and voltage level separations S1", S2", S3" are uniform accordingly so that RLM is 1 or close to 1 (e.g. RLM>0.92, or RLM=0.98). While FIG. 6C shows cancelation of non-linearity to provide a transfer curve that is a straight line, real amplifiers may not achieve such a straight line and some non-linearity may remain. For example, single-output amplifiers tend to have low amplification at lower input voltage ranges (e.g. as shown in FIG. 6A). Voltage level separations S1 and S3 may be equalized by an appropriately tuned configurable single-output amplifier stage. However, there may be some differences between outer voltage level separations S1 and S3 and middle voltage level separation S2 (which is generally not compressed in a single-output amplifier stage). FIG. 6D illustrates another example of a transfer curve of combined outputs of a first and second single-ended amplifier stages (e.g. SE and SE') and shows middle voltage level separation S2" being larger than voltage level separations S1" and S3". Dimensions of the present Figures are not intended to be to scale (e.g. output voltage Vout and input voltage Vin may use different scales so that S1", S2", and S3" may be significantly greater than S1, S2, S3).

Figure 7:
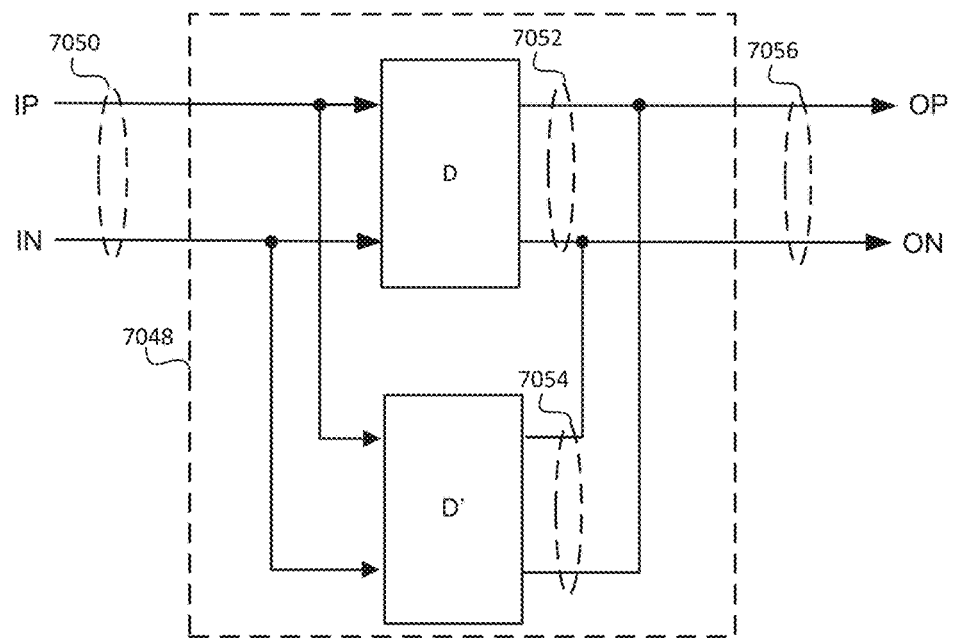
FIG. 7 illustrates an example of a differential amplifier circuit with primary and secondary differential amplifier circuits connected with opposite polarity.

FIG. 7 illustrates an example of an individual differential amplifier stage 7048 (a differential-input differential-output amplifier stage) with a primary differential amplifier circuit D and secondary differential amplifier circuit D' arranged to cancel or partially cancel non-linearity. FIG. 7 shows primary differential amplifier circuit D connected to receive a differential input 7050 (including two individual conductors providing inputs IP and IN) and provide a primary differential output 7052 that has a first non-linearity (e.g. first RLM value). Secondary differential amplifier circuit D' is connected to receive differential input 7050 (same differential input as primary differential amplifier circuit D receives) and to generate a secondary differential output 7054 with a second non-linearity (e.g. second RLM value). Secondary differential output 7054 and primary differential output 7052 are coupled together with opposite polarities to generate a combined output 7056 that has a combined non-linearity according to the first and second non-linearities. Primary and secondary differential amplifier circuits D and D' are configured such that the second non-linearity cancels out at least the first non-linearity (i.e. combined output 7056 has a combined non-linearity that is less than the first non-linearity). Connected in this way, with opposite polarity, the outputs of primary and secondary differential amplifier stages D and D' are in opposition and tend to cancel out (i.e. amplitude of combined output 7056 is less than the amplitude of primary differential output 7052). Primary differential amplifier circuit D is more powerful than secondary differential amplifier circuit D' so that this cancelation is limited and reduction in amplitude is not excessive. Non-linearity of secondary differential amplifier circuit D' is greater than non-linearity of primary differential amplifier circuit D so that even with reduced power the canceling effect of non-linearity is significant. Differential amplifier stage 7048 may be used in a series of differential amplifier stages (e.g. one or more of stages D1 to Dn of differential amplifier 3034 may be implemented by a circuit with primary and secondary differential amplifier circuits as in differential amplifier stage 7048). In addition to canceling out non-linearity of a primary differential amplifier circuit, a secondary differential amplifier circuit may cancel out non-linearity of one or more other components (e.g. secondary differential amplifier circuit D' may overcompensate for non-linearity of primary amplifier circuit D to provide additional compensation for other components so that the combined outputs of primary and secondary differential amplifier circuits D and D' may have opposite linearity to the output of primary amplifier circuit D alone). Thus, secondary differential amplifier circuit D' cancels out non-linearity of at least primary differential amplifier D and may cancel out non-linearity of additional components including additional amplifier stages (e.g. other differential amplifier stages and/or single-output amplifier stages).

Figure 8A:
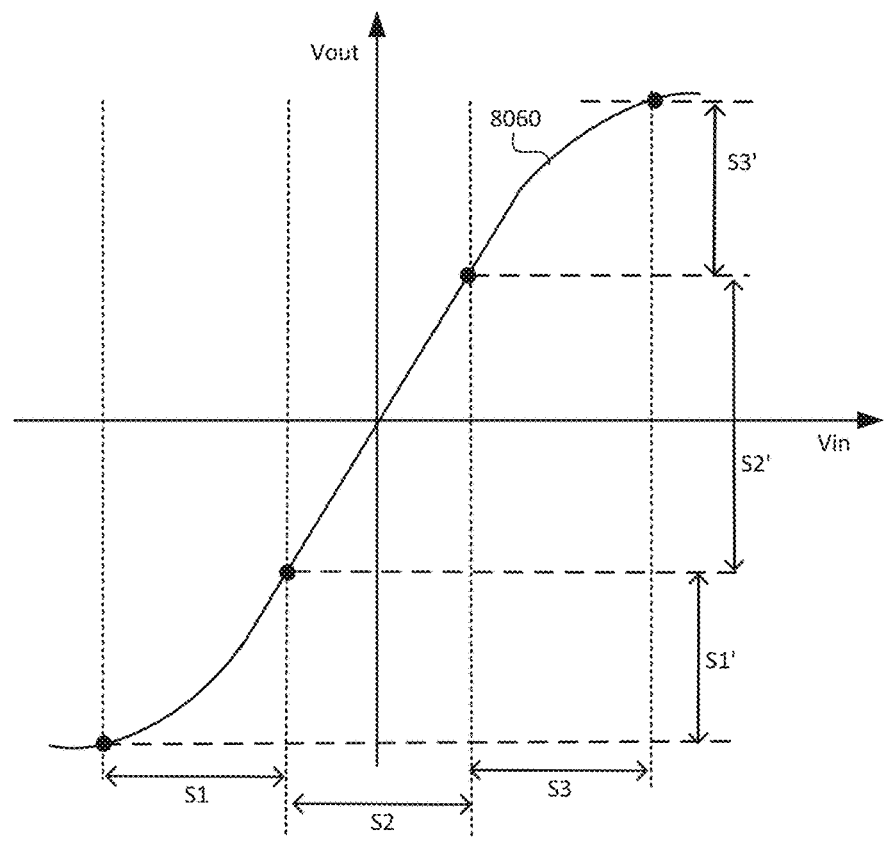
FIGS. 8A-C illustrate an example of canceling out non-linearity by primary and secondary differential amplifier circuits connected with opposite polarity.

FIG. 8A illustrates an example of effects of non-linear amplification by a differential-input differential-output amplifier stage such as primary differential amplifier stage D of FIG. 7. FIG. 8A shows a first transfer curve 8060 of such a primary differential amplifier stage. An input signal is provided with uniform voltage level separations S1, S2, S3 as shown by input voltage Vin. An output signal, output voltage Vout, shows significant non-linearity as illustrated by different voltage level separations S1', S2', S3'. It can be seen that non-linear amplification tends to increase voltage level separation in a mid-voltage range compared with voltage level separations at outer voltage ranges so that S2' is larger than S1' and S3' (i.e. S1' and S3' are compressed with respect to S2'). In general, differential amplifiers tend to compress top (S3) and bottom (S1) voltage level separations equally while single-ended amplifiers tend to compress the top (S3) voltage level separation (e.g. as shown in FIG. 6A) in an asymmetric manner. Canceling such non-linearity may be achieved with an appropriate secondary differential amplifier circuit such as secondary differential amplifier circuit D'.

Figure 8B:
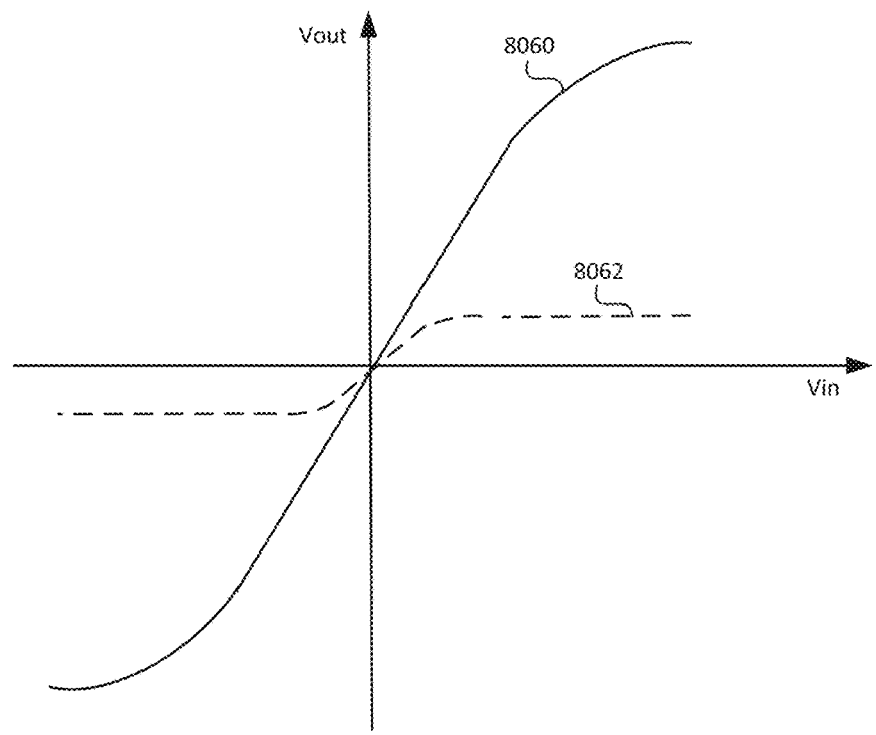

FIG. 8B illustrates an example of a second transfer curve 8062 of secondary differential amplifier circuit D' compared with first transfer curve 8060 of primary differential amplifier circuit D. It can be seen that the second transfer curve 8062 is linear over a smaller range than first transfer curve 8060. When the primary and secondary differential amplifier circuits D and D' are connected with opposite polarities as illustrated in FIG. 7, the outputs of these amplifier circuits are in opposition and the resulting transfer curve of the combined differential amplifier circuits may be obtained by the difference between first transfer curve 8060 and second transfer curve 8062.

Figure 8C:
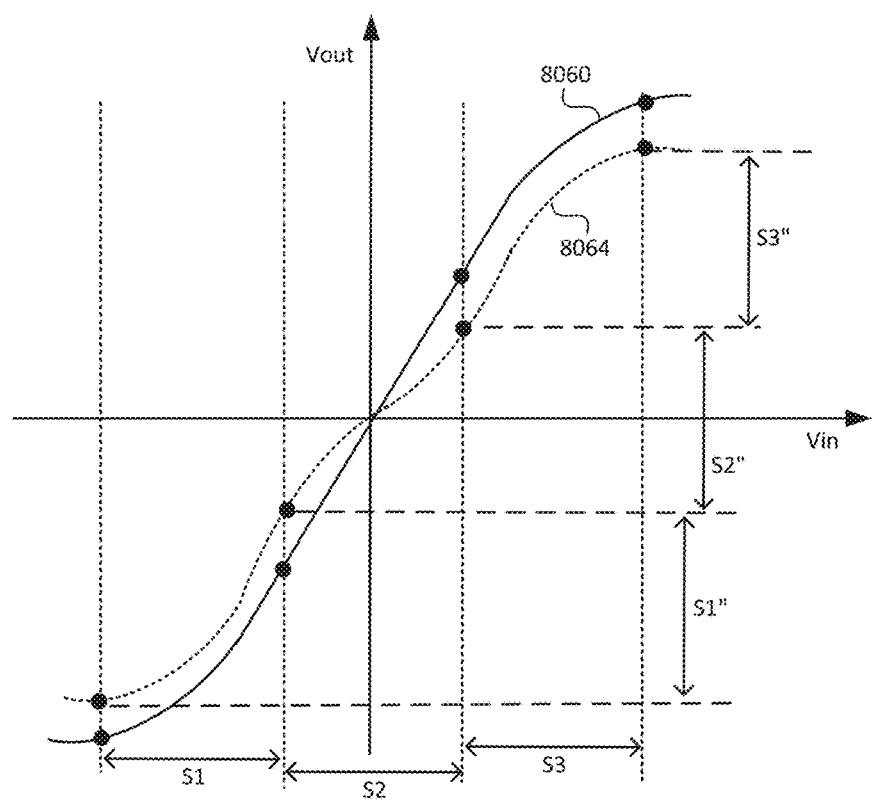

FIG. 8C illustrates an example of a second transfer curve 8064 of combined primary and secondary differential amplifier circuits D and D' connected as illustrated in FIG. 7. Because primary and secondary differential amplifier circuits D and D' are coupled together with opposite polarity, output voltage range is reduced compared with primary differential amplifier circuit D alone (i.e. second transfer curve 8064 shows as smaller range of Vout than first transfer curve 8060 for the same input voltage range). Thus, the sum of voltage level separations S1', S2', and S3' is reduced compared with the sum of voltage level separations S1, S2, and S3 of FIG. 8A. This reduction in voltage level separation is greatest for voltage level separation S2' so that S2' is equal to voltage level separations S1' and S3'. By configuring a secondary differential amplifier circuit appropriately according to non-linearity of one or more primary differential amplifier circuit, non-linearity may be canceled out (at least partially) while maintaining gain of the combined differential amplifier circuits at an adequate level (i.e. combined amplitude is not excessively reduced). While FIGS. 8A-C show particular illustrations of such cancellation, these are for illustration and it will be understood that the present technology may be applied to a wide range of amplifier circuits with a range of different transfer curves. For example, a secondary amplifier circuit in a differential amplifier stage may be used to cancel out non-linearity for more than one primary amplifier circuit so that one differential amplifier stage with a secondary amplifier circuit may be used to cancel non-linearity for the differential amplifier stage and one or more other amplifier stages (e.g. differential amplifier stages and/or single-output amplifier stages), which may not have their own secondary amplifier circuits. Such a secondary amplifier stage may overcompensate for non-linearity of the primary differential amplification circuit of the differential amplifier stage in which it is located (e.g. may generate a combined non-linearity that has an opposite ratio of S1 and S3 to S2 to the primary amplifier circuit so that S2" would be compressed compared with S1" and S3"—the opposite ratio to that of FIG. 8A). Curves shown in the present Figures including FIGS. 8A-C are not intended to be to scale.

Figure 9:
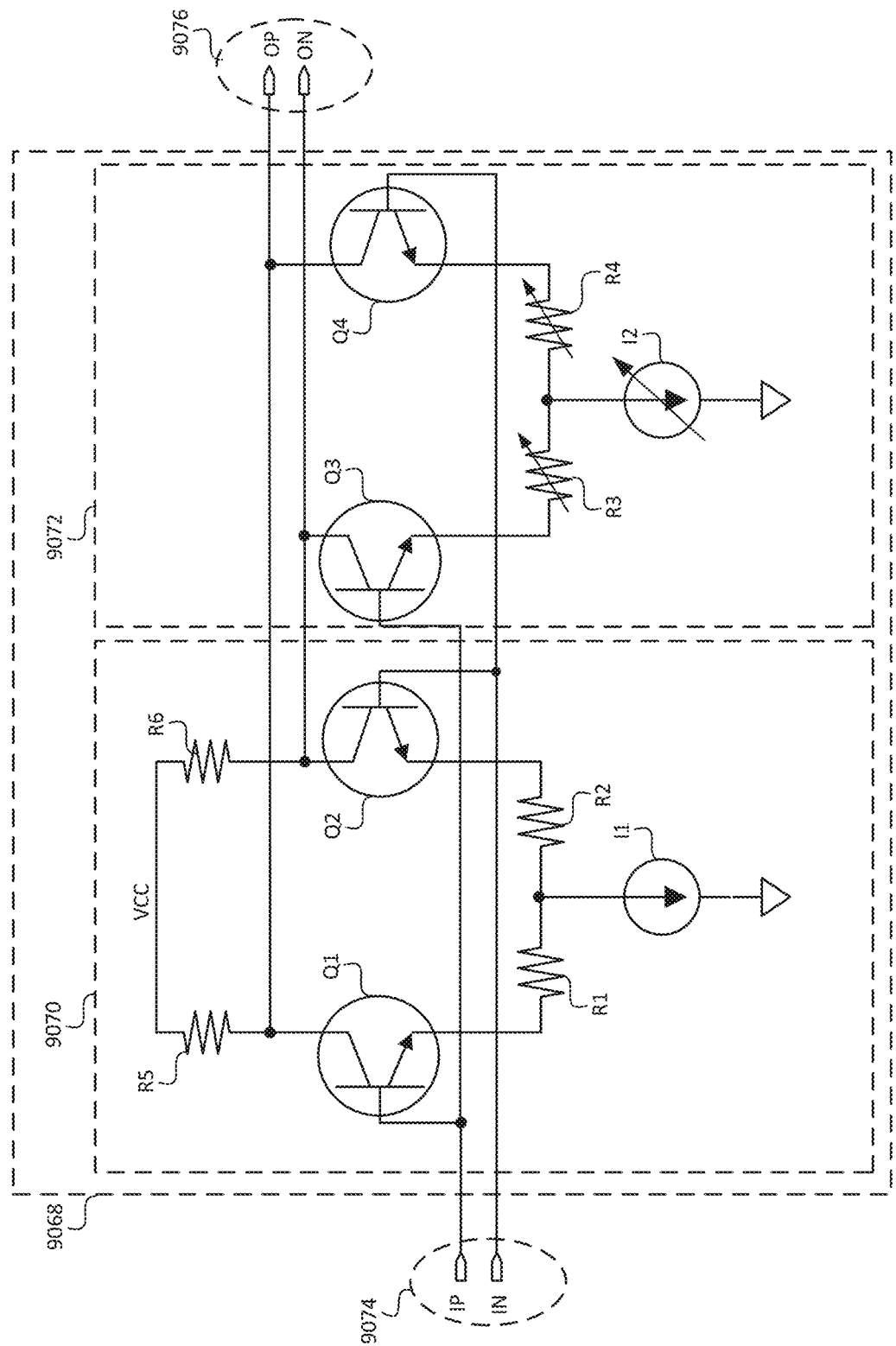
FIG. 9 illustrates an example implementation of a differential amplifier circuit with primary and secondary differential amplifier circuits connected with opposite polarity.

FIG. 9 illustrates an example implementation of a differential amplifier stage 9068 that includes a primary differential amplifier circuit 9070 and a secondary differential amplifier circuit 9072 that are coupled together with opposite polarity. Primary differential amplifier circuit 9070 and a secondary differential amplifier circuit 9072 in differential amplifier stage 9068 may be considered an example implementation of primary differential amplifier circuit D and a secondary differential amplifier circuit D' of differential amplifier stage 7048 shown in FIG. 7. Primary differential amplifier circuit 9070 is connected to receive a differential input 9074, which includes individual inputs IP and IN. Individual inputs IP and IN are coupled to two primary transistors, primary transistors Q1 and Q2 respectively, in a primary differential pair. Primary transistors Q1 and Q2 are controlled by individual inputs IP and IN respectively. In the example shown, primary transistors Q1 and Q2 are bipolar transistors with IP and IN connected to their bases. In other examples, Q1 and Q2 may be MOSFET transistors with IP and IN connected to their gates. Primary transistors Q1 and Q2 are connected to a primary current source I1 through resistors R1 and R2 respectively and are connected to a supply voltage Vcc through resistors R5 and R6 respectively in a differential pair arrangement. In some cases, primary current source I1 may be replaced with a resistor. In some examples, resistors R1 and R2 may be variable resistors and primary differential amplifier circuit may be a variable gain amplifier controlled by R1 and R2.

Secondary differential amplifier circuit 9072 is connected to receive differential input 9074. Individual inputs IP and IN are coupled to secondary transistors Q3 and Q4 respectively in a secondary differential pair. Secondary transistors Q3 and Q4 are controlled by individual inputs IP and IN respectively. In the example shown, secondary transistors Q3 and Q4 are bipolar transistors with IP and IN connected to their bases. In other examples, Q3 and Q4 may be MOSFET transistors with IP and IN connected to their gates. Secondary transistors Q3 and Q4 are connected to a secondary current source I2 through resistors R3 and R4 respectively. In some cases, current source I2 may be replaced with a resistor. Secondary current source I2 is a variable current source and resistors R3 and R4 are variable resistances for tuning non-linearity of secondary differential amplifier circuit 9072 (i.e. secondary differential amplifier circuit 9072 is configurable to have different non-linearity). In general, secondary current source I2 provides a current that is smaller than a current provided by primary current source I1 and transistors Q3 and Q4 are smaller than transistors Q1 and Q2 so that secondary differential amplifier circuit 9072 is lower powered than primary differential amplifier circuit 9070. Secondary transistors Q3 and Q4 are connected to supply voltage Vcc through resistors R6 and R5 respectively, which are shared with primary differential amplifier circuit 9070. Primary transistor Q1, controlled by individual input IP, and secondary transistor Q4, controlled by individual input IN have upper terminals connected together. Primary transistor Q2, controlled by individual input IN, and secondary transistor Q3, controlled by individual input IP have upper terminals connected together. In this configuration, the differential output of secondary differential amplifier circuit 9072 is in opposition to the differential output of primary differential amplifier circuit 9070 so that combined output 9076 has lower amplitude than the output of primary differential amplifier circuit 9070 alone. With appropriate configuration of secondary current source I2 and variable resistors R3 and R4, non-linearity of secondary differential amplifier circuit 9072 may be tuned to cancel non-linearity of primary differential amplifier circuit 9070 (e.g. as illustrated in FIGS. 8A-8C). Transistor sizes are fixed, with transistors Q3 and Q4 being some fraction of the size of transistors Q1 and Q2 (e.g. 1/10). Resistors R3 and R4 may be scaled also compared with resistors R1 and R2. Resistors R3 and R4 may be scaled differently to transistors Q3 and Q4 (e.g. where transistors Q3 and Q4 are scaled to 1/10 the size of transistors Q1 and Q2, resistors R3 and R4 would be increased ten times to provide a similar transfer curve, but may be smaller than this to obtain a transfer curve with increased non-linearity and smaller linear range). The non-linearity of secondary differential amplifier circuit 9072 (and thus non-linearity of differential amplifier stage 9068) may be varied by varying resistances of resistors R3 and R4 (which may be identical and may be changed together). In general, reducing resistance of resistors R3 and R4 produces greater non-linearity and a smaller linear range. Secondary current source I2 may be scaled according to scaling of transistors Q3 and Q4 (e.g. 1/10 of current through primary current source I1). Secondary current source I2 may be varied as resistors R3 and R4 are varied so that enough non-linearity cancellation is achieved while power consumption is kept low. In some cases, secondary current source I2 may provide a fixed current (e.g. fixed at 1/10 of current through primary current source I1). Tuning to find an appropriate configuration may be done as part of testing or product configuration (e.g. in a factory) while the output of an amplifier containing differential amplifier stage 9068 is connected to test equipment so that non-linearity may be measured (e.g. measured as an RLM value for a PAM4 signal) as changes are made to R3, R4, and I2. Resistance of resistors R3 and R4 may then be configured to a resistance that provides low non-linearity (e.g. RLM within a range such as >0.92).

While the above example of differential amplifier circuits canceling out non-linearity includes a primary differential amplifier circuit of greater power and a smaller differential amplifier circuit of lower power and greater non-linearity connected with opposite polarity, other configurations are possible. In some cases, an amplifier circuit with configurable non-linearity may be connected in series with one or more other amplifier circuit and may be used to cancel out (at least partially) the non-linearity of another amplifier circuit or amplifier circuits. Such an amplifier circuit with configurable non-linearity does not act in opposition to other amplifier circuits and so may be of similar power (i.e. it contributes to overall gain of amplifier circuits connected in series).

Figure 10A:
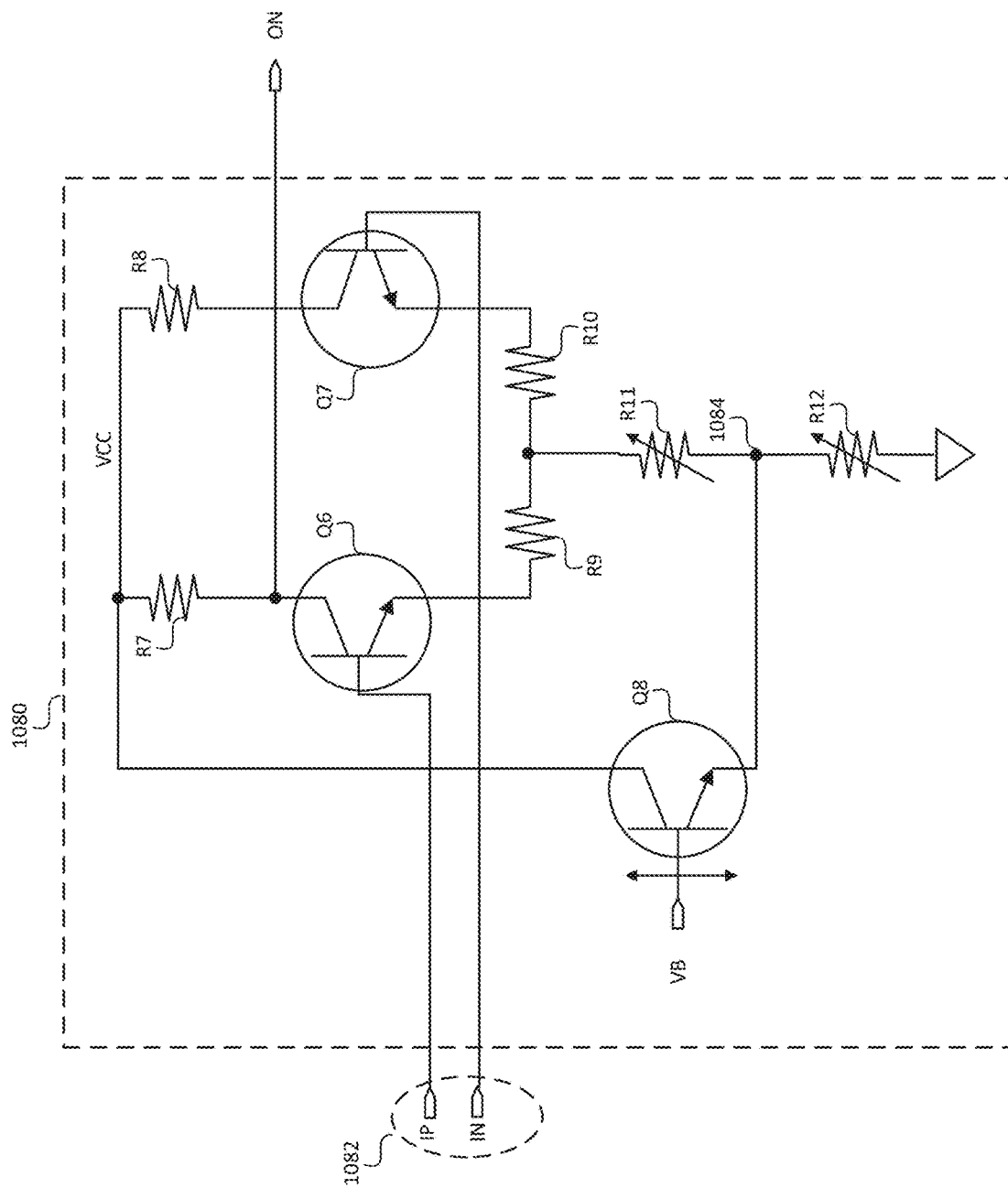
FIGS. 10A-E illustrate examples of differential-input single-output amplifier stages with configurable non-linearity.

In an example shown in FIG. 10A a single-output amplifier stage 1080 is configured so that it may be used as a differential to single-ended converter (e.g. may be used as converter 3036). Single-output amplifier stage 1080 is a differential-input single-output amplifier so that it may receive a differential input from a differential amplifier stage and may provide an output to a single-input amplifier stage. Single-output amplifier stage 1080 has configurable non-linearity so that it can be tuned to cancel out non-linearity of one or more other stages connected in series (e.g. for one or more single-output amplifier stage SE1-SEm of single-output amplifier 3038). Single-output amplifier stage 1080 receives differential input 1082, which includes individual inputs IP and IN, which are connected to control transistors Q6 and Q7 respectively (transistors Q6 and Q7 are shown as bipolar transistors in this example and may be MOSFETs in other examples). Transistors Q6 and Q7 are connected to a supply voltage Vcc through resistors R7 and R8 respectively, with a single-output ON generated between resistor R7 and transistor Q6. Transistors Q6 and Q7 are also connected to node 1084 through transistors R9, R10 and R11. Node 1084 is connected to ground through resistor R12. Resistors R11 and R12 are variable resistors in this example. Node 1084 is also connected to the emitter of transistor Q8, which is controlled by a configurable voltage bias VB. This generates a voltage source at node 1084 that is about one diode drop below configurable bias voltage VB.

Figure 10B:
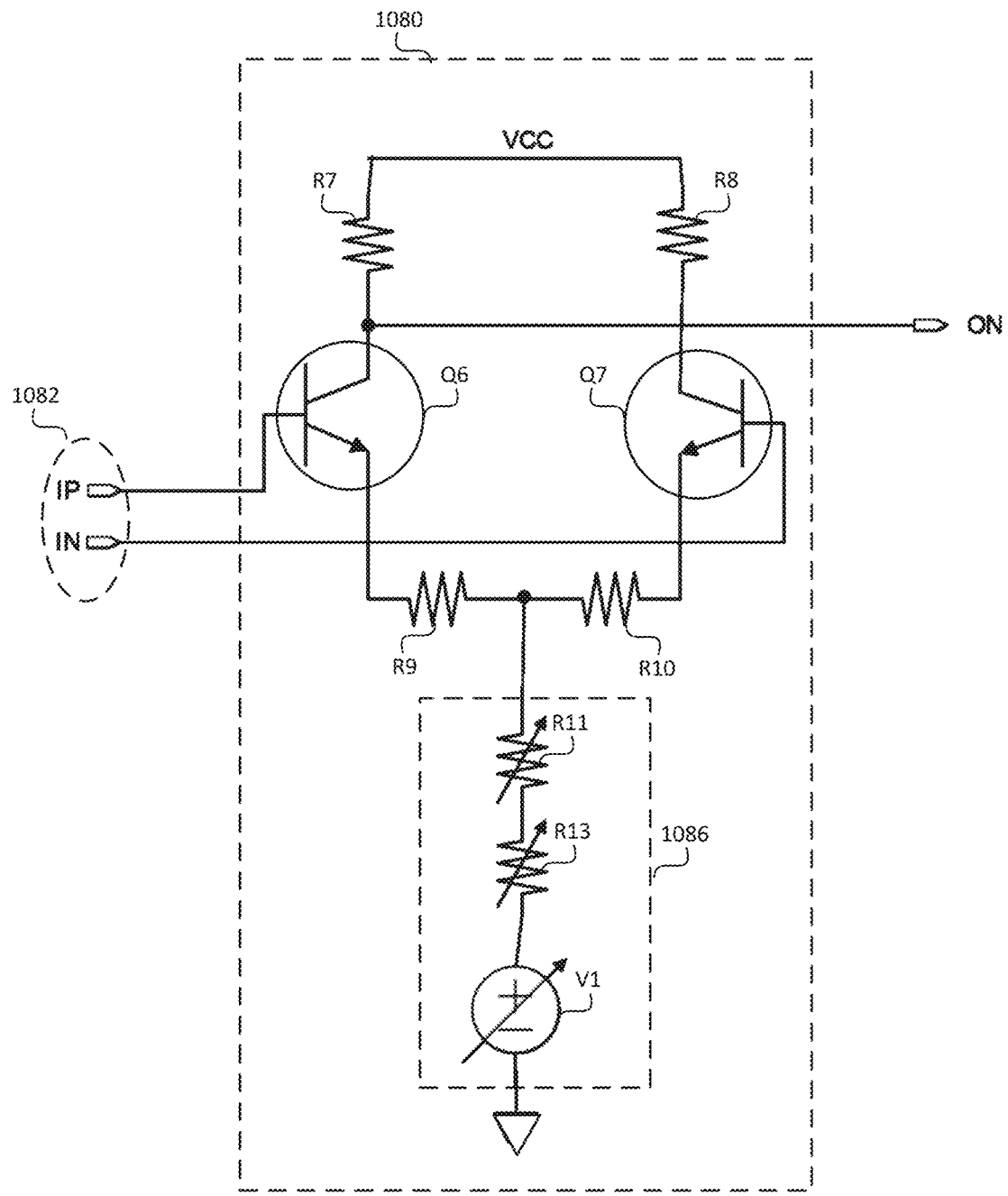

An equivalent circuit of transistor Q8 and resistor R12 is a voltage source in series with a small resistor. This is shown in the equivalent circuit illustration of FIG. 10B by voltage source V1 in series with resistor R13. The resistance of resistor R13 is the resistance of resistor R12 in parallel with the output resistance of transistor Q8 and is thus a variable resistance. By adjusting the current through transistor Q8, its output resistance can be made very small. Therefore, this amplifier may be considered as a single-output differential amplifier with a tail 1086 made of a resistors R11 and R13 in series with voltage source V1 (as illustrated in FIG. 10B).

The gain of single-output amplifier stage 1080 is mainly determined by the ratio of resistance of resistor R7 to that of resistor R9. However, since the output ON is a single output with a tail equivalent to a resistor in series with a configurable voltage source, single-output amplifier stage 1080 displays non-linearity behavior of a single-output amplifier stage and is referred to here as a single-output amplifier stage. That is, its gain is lower when the input voltage at IP is lower (since the current through transistor Q6 is lower at that input level and the gain of transistor Q1 is directly proportional to the current through it). When transmitting a PAM4 signal, for example, this results in smaller level separation S3 of the PAM4 signal at its output (see FIG. 6A). The degree of the non-linearity is determined by the tail resistance of resistors R11 and R12. Since the next single-output amplifier stage after single-output amplifier stage 1080 inverts the PAM4 signal, the smaller S3 from single-output amplifier stage 1080 results in smaller voltage level separation S1 from the next amplifier stage (e.g. as illustrated in FIG. 6B). By adjusting the voltage VB and the resistances of R11 and R12 accordingly, the average currents through R11 can be kept unchanged. This enables adjustment of the non-linearity of single-output amplifier stage 1080 without affecting its output common-mode voltage. With proper adjustment of its non-linearity, the mismatch between voltage level separations S1 and S3 can be reduced or minimized at an output of the last single-output amplifier stage in a series of single-output amplifier stages (see FIG. 6C). In another implementation, resistor R12 may be replaced with a current source.

Figure 10C:
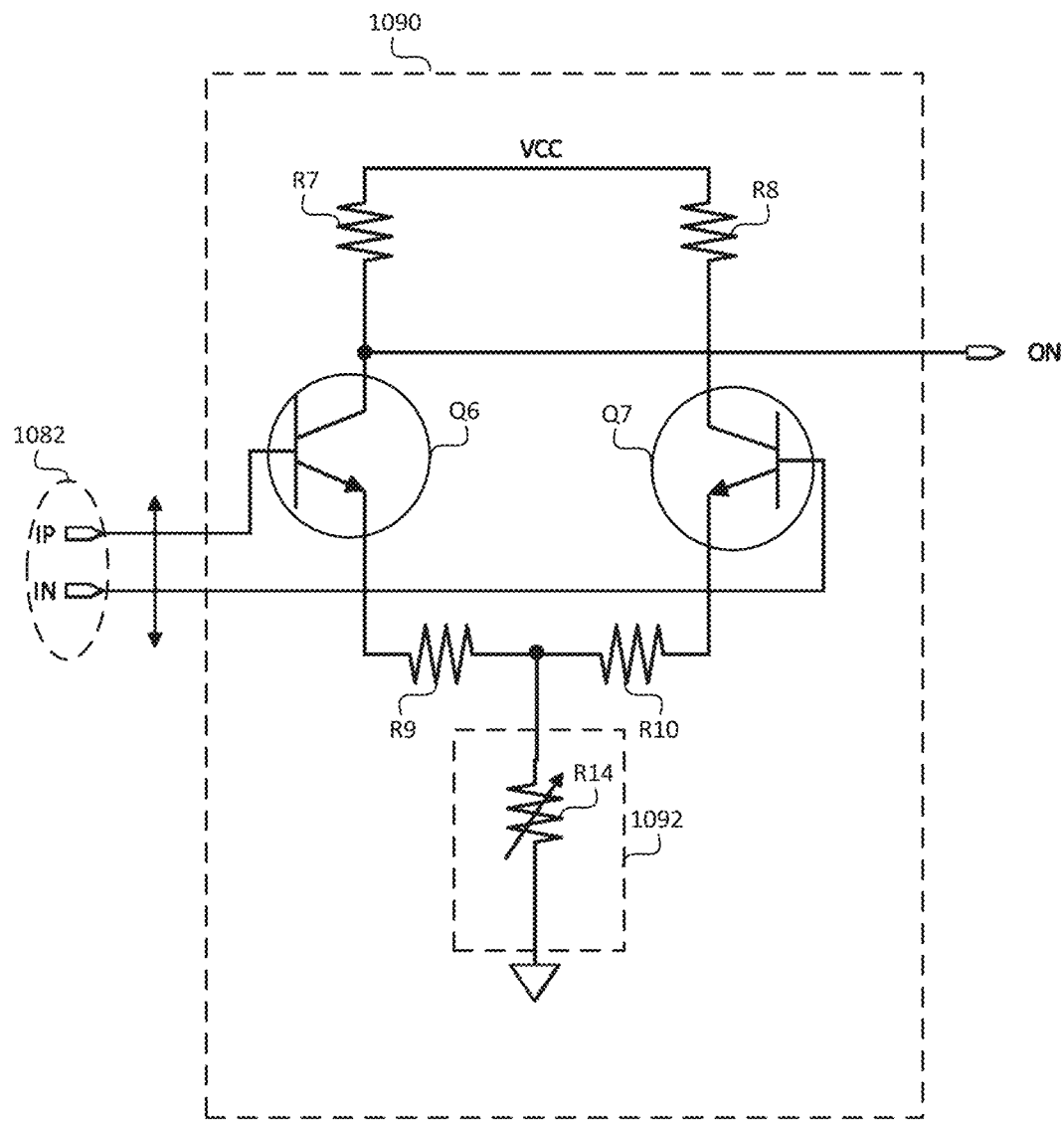

FIG. 10C shows an example of an alternative implementation of a differential-input single-output amplifier stage 1090 where a tail 1092 is formed by a variable resistance R14 connected directly to ground, without a transistor like transistor Q8 to provide a configurable voltage source (other components are the same as single-output amplifier stage 1080 and are similarly numbered). The non-linearity of single-output amplifier stage 1090 can be adjusted by changing the resistance of resistor R14. However, this will change the tail current and therefore the output common-mode voltage of single-output amplifier stage 1090. To keep the tail current constant, the input common-mode voltage may be adjusted accordingly. For larger non-linearity correction, smaller R14 and lower input common-mode voltage may be used. This may reduce the headroom of the previous differential amplifier stage (i.e. of differential amplifier stage providing differential input 1082).

Figure 10D:
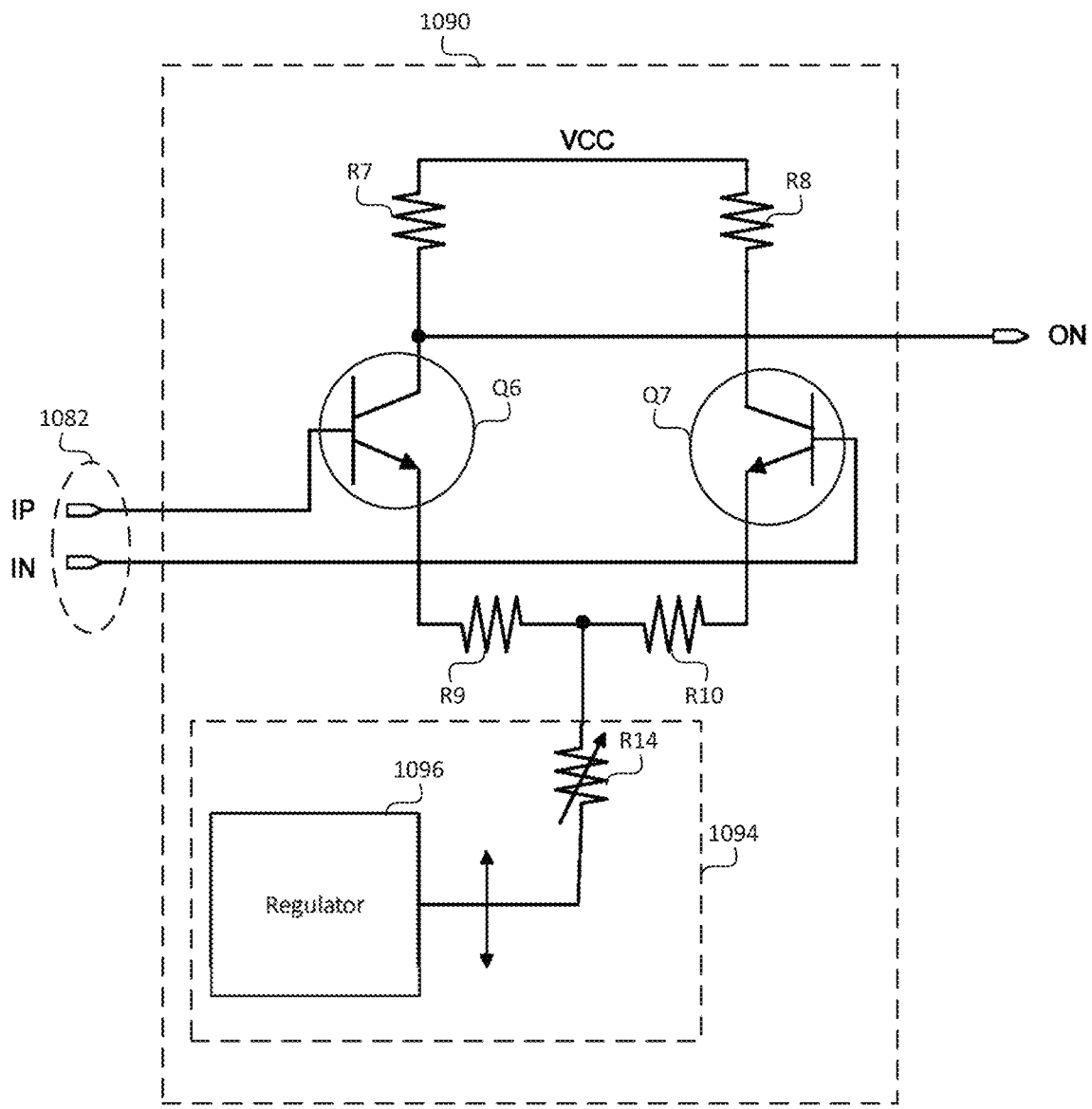

FIG. 10D shows another alternative implementation in which a differential-input single-output amplifier stage 1090 is formed with a tail 1094 that includes a regulator 1096 (other components that are the same as in previous Figures are similarly numbered). Regulator 1096 may include a Low Drop Out (LDO) regulator circuit or other suitable voltage regulation to provide a bottom voltage for single-output amplifier stage 1090 (i.e. to provide a voltage to the bottom of the differential pair formed by transistors Q6 and Q7. Since regulator 1096 requires a feed-back loop to maintain a constant voltage, it may not respond quickly enough when input voltages of differential input 1082 change. This may cause non-uniform response over the frequency range of the input signal of differential input 1082.

Figure 10E:
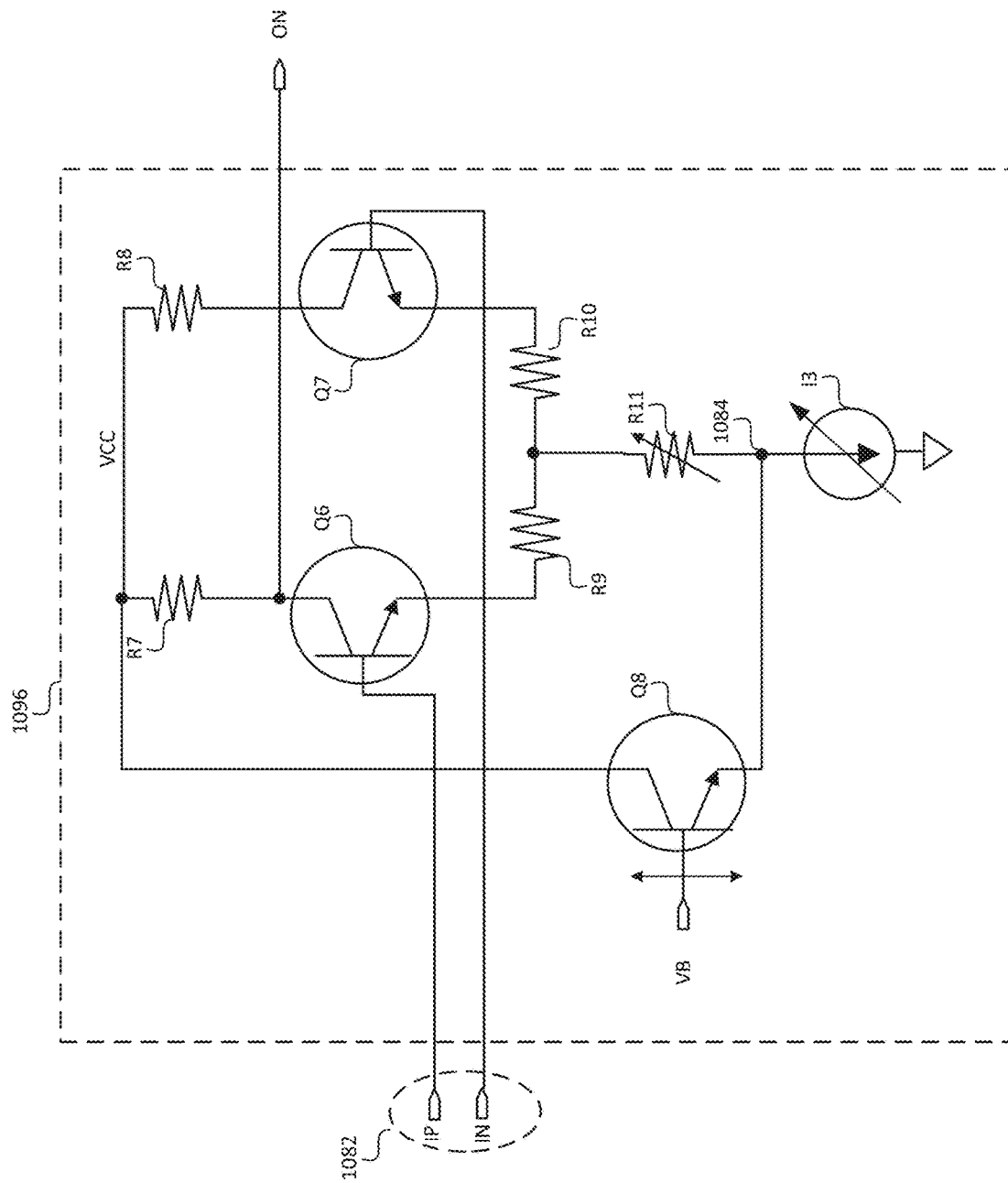

FIG. 10E shows another alternative implementation in which a differential-input single-output amplifier stage 1096 is formed with a current source I3 to provide a constant current at node 1084. Differential-input single-output amplifier stage 1096 may be considered a variation of differential-input single-output amplifier stage 1080 with resistor R12 replaced by current source I3. Components of differential-input single-output amplifier stage 1096 are numbered as in differential-input single-output amplifier stage 1080 of FIG. 10A. Differential-input single-output amplifier stage 1096 may be less sensitive to common mode voltage than differential-input single-output amplifier stage 1080 (i.e. may have a higher common mode rejection ratio (CMMR)).

Figure 11A:
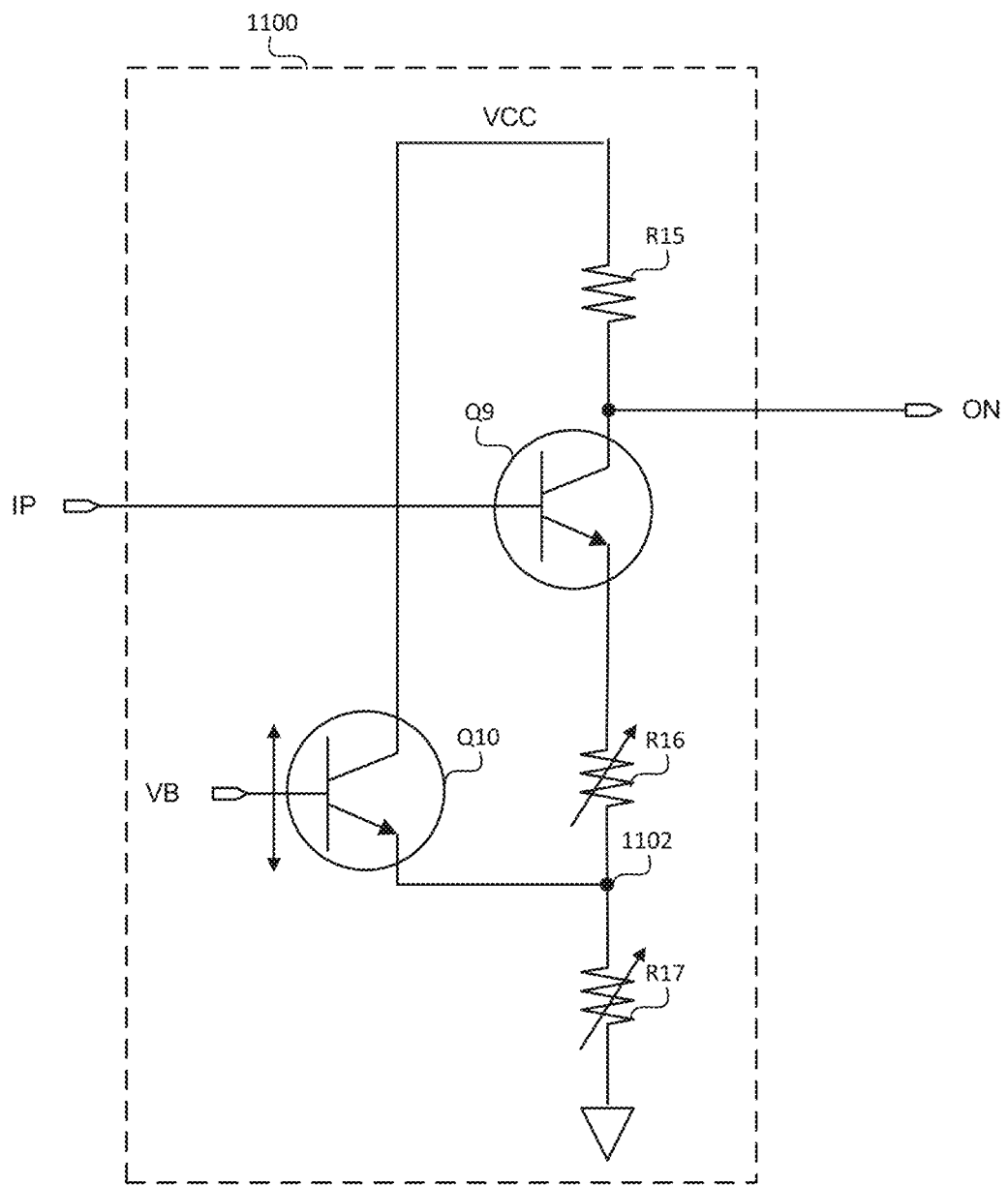
FIGS. 11A-C illustrate examples of single-input single-output amplifier stages with configurable non-linearity.

While the examples of FIGS. 10A-E show single-output amplifier stages that receive differential inputs, aspects of the present technology may also be applied to single-output amplifier stages that receive a single input (single-input single-output amplifier stages). FIG. 11A shows an example of a single-output amplifier stage 1100 with a single input IP that has configurable non-linearity and may be used to cancel non-linearity of another amplifier stage (e.g. may be used as second amplifier stage SE' of FIG. 5 and may receive input IP from first single-output amplifier stage SE). Single-output amplifier stage 1100 includes transistor Q9, which has its base connected to input IP so that transistor Q9 is controlled by input IP. The upper terminal (collector in this example) of transistor Q9 is connected to supply voltage VCC through resistor R15 and its lower terminal (emitter in this example) is connected to ground through resistors R16 and R17, which are connected by node 1102. While transistor Q9 is a bipolar transistor in this example, other types of transistor may also be used, e.g. Q9 may be a MOSFET. Resistors R16 and R17 are variable resistors. Single-output amplifier stage 1100 also includes a second transistor Q10 with its emitter connected to node 1102. Second transistor Q10 is controlled by a variable bias VB applied to its base. Second transistor Q10, which is configurable using voltage bias VB, in combination with resistor R17 acts as a variable voltage source as illustrated in FIG. 11B.

Figure 11B:
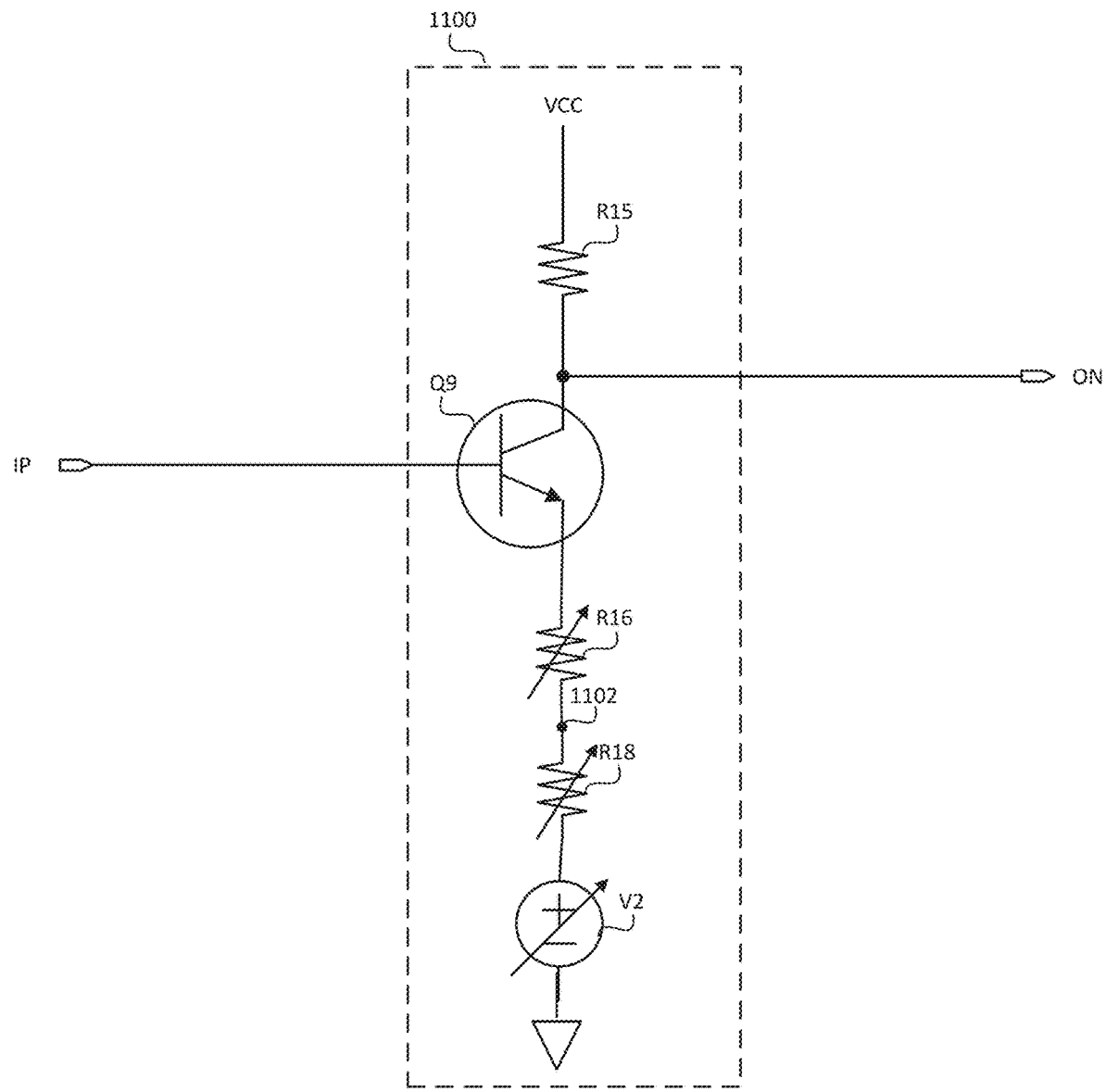
Figure 11C:
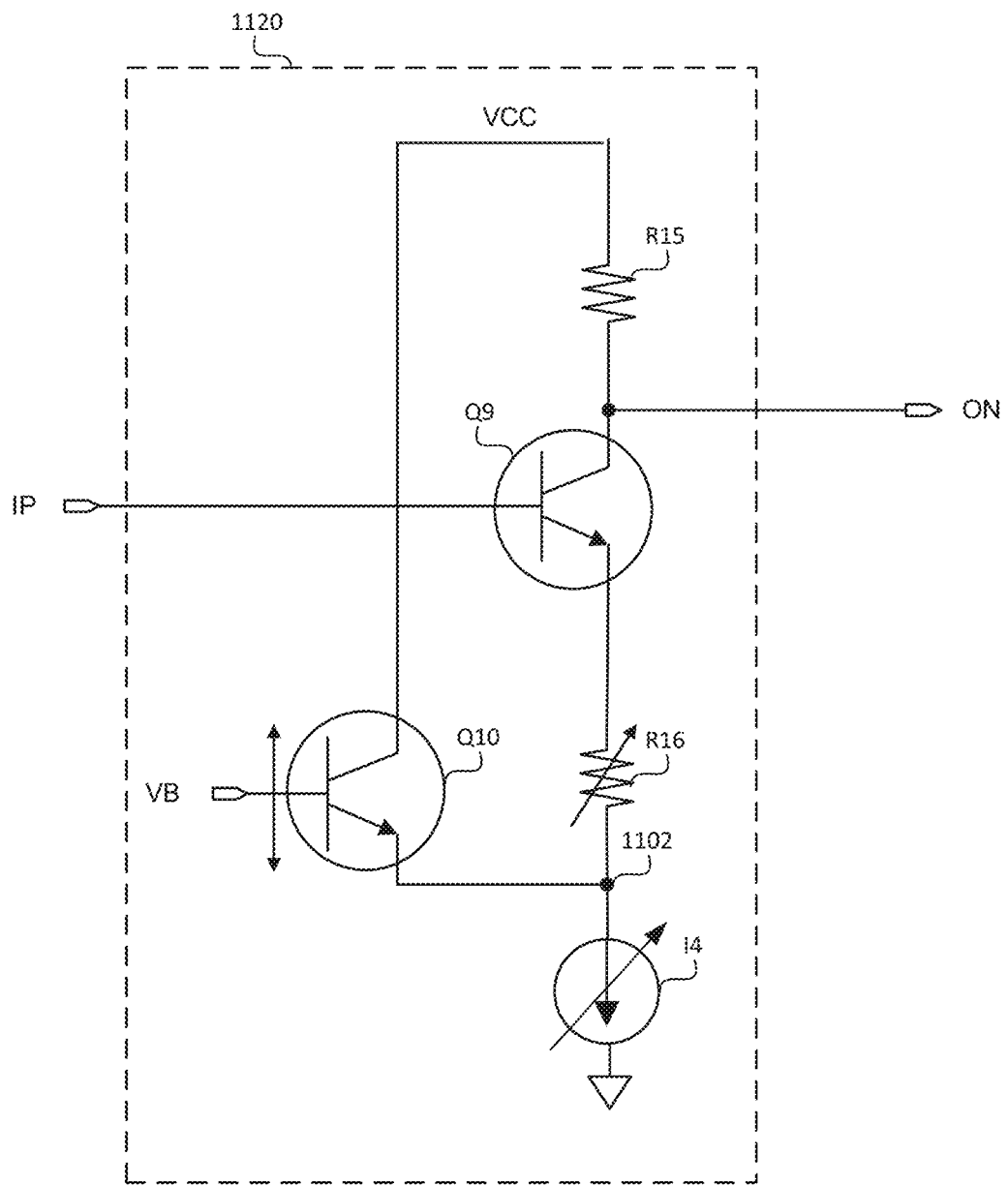

FIG. 11B shows an equivalent circuit diagram corresponding to single-output amplifier stage 1100 of FIG. 11A with a variable voltage source V2. Variable voltage source V2 and resistor R18 can be configured to provide a desired voltage at node 1102 (i.e. by adjusting VB and adjusting resistance of resistor R17). The non-linearity of single-output amplifier stage 1100 is determined by resistances of resistors R16 and R18, while the average current through transistor Q9 is determined by the common-mode voltage of IP, the resistance of resistors R16 and R18 and the voltage of voltage source V2. With proper adjustment of R16, R18 and V2, the average current through transistor Q9 (thus the output common-mode voltage) is unchanged, but non-linearity of single-output amplifier stage 1100 can be adjusted so that the level separation mismatch between at least voltage level separations S1 and S3 is reduced at output OP. In another example, a voltage regulator may be used as shown for a differential-input single-output amplifier stage 1090 in FIG. 10D. FIG. 11C shows another alternative implementation of a single-output amplifier stage. Single-output amplifier stage 1120 is formed with a current source I4 to provide a constant current at node 1102. Components of single-output amplifier stage 1120 are numbered as in single-output amplifier 1100 of FIG. 11A. The non-linearity of single-output amplifier stage 1120 depends on the resistance of resistor R16 and the voltage at node 1102. By adjusting the resistance of resistor R16 and the voltage at node 1102 (via voltage bias VB) appropriately, non-linearity may be tuned to cancel out non-linearity of one or more other single-output amplifier stages (e.g. configured to obtain transfer curve of FIG. 6B to cancel out S1 and S3 mismatch in transfer curve of FIG. 6A). Current source I4 may be adjusted to maintain constant current flow through transistor Q9 as VB and R11 are adjusted. Tuning to find an appropriate configuration may be done as part of testing or product configuration (e.g. in a factory) while the output of an amplifier containing single-ended amplifier stage 1120 is connected to test equipment so that waveform parameters may be measured (e.g. as S1, S2, and S3 values for a PAM4 signal) as changes are made to resistor R16, voltage bias VB, and current source I4. Resistance of resistor R16, voltage bias VB, and current of current source I4 may then be configured to provide low non-linearity (e.g. best matching between S1 and S3).

Figure 12:
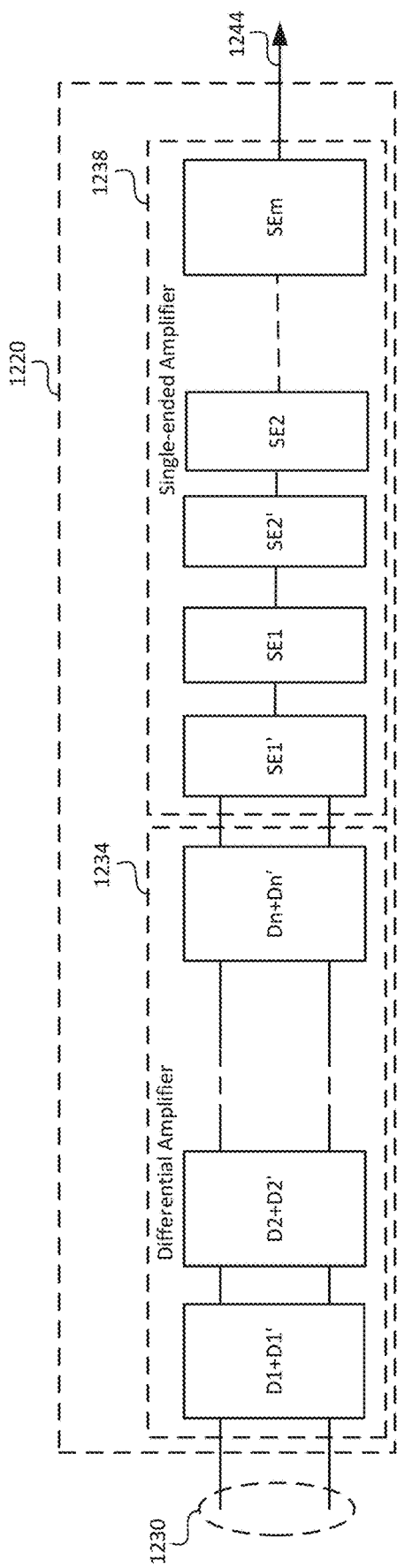
FIG. 12 illustrates an example of an amplifier with multiple amplifier stages that cancel out non-linearity.

Aspects of the present technology may be used in a variety of different types of amplifier stages (including differential amplifier stages and single-output amplifier stages) used in a variety of different applications. For example, in an amplifier, or driver, coupled to an optical transmitter, such as a VCSEL, (e.g. configured as shown in FIG. 3B) one or more amplifier stages with configurable non-linearity may be incorporated at one or more locations. FIG. 12 shows an example of an amplifier 1220 that receives a differential input 1230, which is amplified by differential amplifier 1234 by a series of n differential amplifier stages. In this example, each differential amplifier stage includes amplifier circuits that are paired so that the non-linearity of a primary amplifier circuit (e.g. primary differential amplifier circuit D1) is canceled out by a secondary amplifier circuit (e.g. secondary amplifier circuit D1'). Differential amplifier circuits in such pairs may be coupled with opposite polarity as illustrated in FIG. 7 and/or FIG. 9 so that their outputs cancel out as illustrated in FIGS. 8A-8C. In other examples, only some (fewer than n) differential amplifier stages may have circuits paired in this manner (e.g. sufficient linearity canceling for two or more primary circuits may be achieved by one secondary circuit so that there are fewer secondary circuits than primary circuits, for example, a secondary differential amplifier circuit in one differential amplifier stage may cancel out non-linearity of a chain of differential amplifier stages).

Differential amplifier 1234 is configured to provide a differential output to single-output amplifier 1238, which includes series connected single-output amplifiers SE1-SEm'. Single-output amplifiers SE1-SEm' are arranged in pairs with alternate amplifier stages having tunable non-linearity to cancel out non-linearity (e.g. mismatch between voltage level separations S1 and S3) of neighboring single-output amplifier stages (e.g. single-output amplifier stage SE1' may be configurable to cancel out non-linearity of single-output amplifier stage SE as previously illustrated in FIG. 5, or single-output amplifier stage SE may be configurable to cancel out non-linearity of single-output amplifier stage SE').

In this example, single-output amplifier stage SE1' is a differential-input single-output amplifier stage that may be configured as illustrated in one or more of FIGS. 10A-10E so that it has configurable non-linearity that may be tuned to cancel non-linearity (e.g. mismatch between voltage level separations S1 and S3) of single-output amplifier stage SE. Thus, no separate differential to single-output converter is used. Single-output amplifier SE2' may be a single-input single-output amplifier that is configured to cancel out non-linearity of single-output amplifier stage SE2. For example, SE2' may be configured as illustrated in FIGS. 11A-11B so that transfer curves of single-output amplifier stages SE2 and SE2' cancel out, or partially cancel out, e.g. as illustrated in FIGS. 6A-6C. FIG. 12 illustrates an example with m such pairs of single-output amplifier stages (i.e. 2m single-output amplifier stages). In other examples, one or more unpaired single-output amplifier stages may be included (e.g. a single-output amplifier stage with configurable non-linearity may be cancel out non-linearity of two or more other single-output amplifier stages). In general, using configurable single-ended amplifier stages can reduce mismatch from different compression of top (e.g. S3) and bottom (e.g. S1) voltage level separations while using a secondary amplifier circuit in a differential amplifier stage can reduce mismatch between the middle voltage level separation (e.g. S2) and the top and bottom voltage level separations (e.g. S3 and S1, which may be equally compressed). Thus, the combination of these two approaches can correct for a both types of mismatch and can provide a high level of correction and low non-linearity (e.g. an RLM value close to one). Configuration of an amplifier such as amplifier 1220 may include configuring one or more secondary differential amplifier circuits as described above with respect to secondary differential amplifier circuit 9072 (e.g. to reduce or eliminate mismatch between the middle and the top and bottom voltage level separations) and configuring one or more single-ended amplifier stages as described with respect to single-ended amplifier stage 1120 (e.g. to reduce or eliminate mismatch between top and bottom voltage level separations). Tuning to find an appropriate configuration may be performed in any order (e.g. single-ended first, differential second) or may be performed together. Tuning may be done as part of testing or product configuration (e.g. in a factory) while the output of an amplifier such as amplifier 1220 is connected to test equipment so that non-linearity may be measured (e.g. as an RLM value for a PAM4 signal) as changes are made to obtain low non-linearity of amplifier 1220 (e.g. RLM within a range such as >0.92).

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An amplifier circuit, comprising:
   a first single-output amplifier stage having a first non-linearity; and
   a second single-output amplifier stage coupled to the first single-output amplifier stage, the second single-output amplifier stage having configurable non-linearity, the configurable non-linearity of the second single-output amplifier stage configured to cancel out at least a portion of the first non-linearity such that combined non-linearity of at least the first single-output amplifier stage and the second single-output amplifier stage in series is less than the first non-linearity, wherein the second single-output amplifier stage has a differential input and a single-output that is coupled to the first single-output amplifier stage.

2. The amplifier circuit of claim 1 wherein the second single-output amplifier stage includes a differential pair of transistors comprising a first transistor and a second transistor with the differential input controlling the first and second transistors, the amplifier circuit further including a third transistor and a resistor forming a configurable voltage source coupled to a tail of the differential pair.

3. The amplifier circuit of claim 1 wherein the second single-output amplifier stage includes a differential pair of transistors comprising a first transistor and a second transistor with the differential input controlling the first and second transistors, the amplifier circuit further including a variable resistor in series with a voltage source forming a configurable voltage source coupled to a tail of the differential pair.

4. The amplifier circuit of claim 1 wherein the second single-output amplifier stage includes a differential pair of transistors comprising a first transistor and a second transistor with the differential input controlling the first and second transistors, the amplifier circuit further including a variable resistor coupled between a tail of the differential pair and ground.

5. The amplifier circuit of claim 1 wherein the second single-output amplifier stage includes a differential pair of transistors comprising a first transistor and a second transistor with the differential input controlling the first and second transistors, the amplifier circuit further including a variable resistor coupled between a tail of the differential pair and voltage regulator.

6. The amplifier circuit of claim 1 wherein the second single-output amplifier stage includes a differential pair of transistors comprising a first transistor and a second transistor with the differential input controlling the first and second transistors, the amplifier circuit further including a third transistor, and a variable resistor and a variable current source forming a configurable voltage source coupled to a tail of the differential pair.

7. A first single-output amplifier stage having a first non-linearity; and
   a second single-output amplifier stage coupled to the first single-output amplifier stage, the second single-output amplifier stage having configurable non-linearity, the configurable non-linearity of the second single-output amplifier stage configured to cancel out at least the first non-linearity such that combined non-linearity of at least the first single-output amplifier stage and the second single-output amplifier stage in series is less than the first non-linearity
   wherein the second single-output amplifier stage has a single input from the first single-output amplifier stage and wherein the second single-output amplifier stage includes a first transistor controlled by the single input and a configurable voltage source connected in series with the first transistor.

8. The amplifier circuit of claim 7 wherein a first terminal of the first transistor is connected to a supply voltage through a first resistor, a second terminal of the first transistor is connected to a second resistor in series with a third resistor, and a configurable voltage source includes a second transistor connected between the supply voltage and a node located between the second resistor and the third resistor, the second transistor controlled by a configurable bias voltage to control non-linearity.

9. The amplifier circuit of claim 7 wherein a first terminal of the first transistor is connected to a supply voltage through a first variable resistor in series with a second variable resistor in series with a third resistor, and a configurable voltage source.

10. The amplifier circuit of claim 7 wherein a first terminal of the first transistor is connected to a supply voltage through a first resistor, a second terminal of the first transistor is connected to a second resistor in series the configurable voltage source, and a second transistor is connected between the supply voltage and a node located between the second resistor and the configurable voltage source.

11. The amplifier circuit of claim 8 further comprising one or more additional single-output amplifier stages connected in series with the first and second single-output amplifier stages, the configurable non-linearity of the second single-output amplifier stage configured such that combined non-linearity of the first single-output amplifier stage, the second single-output amplifier stage, and the one or more additional single-output amplifier stages in series is less than non-linearity of the first single-output amplifier stage and the one or more additional single-output amplifier stages without the second single-output amplifier stage.

12. The amplifier circuit of claim 11 further comprising one or more differential amplifier stages having differential inputs and differential outputs, the one or more differential amplifier stages connected in series with the first single-output amplifier stage and the second single-output amplifier stage, an output of the amplifier circuit provided to a laser device.

13. The amplifier circuit of claim 7 wherein the first single-output amplifier stage has a single input and a single-output that is coupled to a single input of the second single-output amplifier stage.

14. An amplifier circuit comprising:
   a first single-output amplifier stage having a first non-linearity; and
   a second single-output amplifier stage coupled in series with the first single-output amplifier stage, the second single-output amplifier stage having configurable non-linearity, the configurable non-linearity of the second single-output amplifier stage configured to cancel out at least the first non-linearity such that combined non-linearity of at least the first single-output amplifier stage and the second single-output amplifier stage in series is less than the first non-linearity wherein the second single-output amplifier stage has a differential input and a single-output that is coupled to the first single-output amplifier stage.

15. The amplifier circuit of claim 14 wherein the second single-output amplifier stage includes a first transistor and a second transistor in a differential pair with the differential input controlling the first and second transistors and includes a third transistor and a resistor forming a configurable voltage source coupled to a tail of the differential pair.

16. The amplifier circuit of claim 14 wherein the second single-output amplifier stage has a single input from the first single-output amplifier stage.

17. The amplifier circuit of claim 16 wherein the second single-output amplifier stage includes a first transistor controlled by the single input and a configurable voltage source connected in series with the first transistor.

* * * * *

UNITED STATES PATENT AND TRADEMARK OFFICE
CERTIFICATE OF CORRECTION

PATENT NO. : 12,095,425 B2
APPLICATION NO. : 18/168177
DATED : September 17, 2024
INVENTOR(S) : Yaqi Hu It is certified that error appears in the above-identified patent and that said Letters Patent is hereby corrected as shown below:

In the Claims

- Column 18, Line 66 (Claim 7, Line 13): please replace "single input" with --single-input--

- Column 19, Line 1 (Claim 7, Line 15): please replace "single input" with --single-input--

- Column 19, Line 21 (Claim 10, Line 4): please replace "series the" with --series with the--

- Column 20, Line 7 (Claim 13, Line 2): please replace "single input" with --single-input--

- Column 20, Line 8 (Claim 13, Line 3): please replace "single input" with --single-input--

- Column 20, Line 32 (Claim 16, Line 2): please replace "single input" with --single-input--

- Column 20, Line 36 (Claim 17, Line 3): please replace "single input" with --single-input--

Signed and Sealed this
Twenty-fourth Day of December, 2024

Derrick Brent
*Acting Director of the United States Patent and Trademark Office*